US007675303B2

(12) United States Patent
Kimura et al.

(10) Patent No.: US 7,675,303 B2
(45) Date of Patent: Mar. 9, 2010

(54) CONNECTOR FOR MEASURING ELECTRICAL RESISTANCE, AND APPARATUS AND METHOD FOR MEASURING ELECTRICAL RESISTANCE OF CIRCUIT BOARD

(75) Inventors: Kiyoshi Kimura, Hidaka (JP); Fujio Hara, Hidaka (JP)

(73) Assignee: JSR Corporation, Tokyo (JP)

( * ) Notice: Subject to any disclaimer, the term of this patent is extended or adjusted under 35 U.S.C. 154(b) by 167 days.

(21) Appl. No.: 11/994,865

(22) PCT Filed: Jul. 14, 2006

(86) PCT No.: PCT/JP2006/314027

§ 371 (c)(1),
(2), (4) Date: Jan. 7, 2008

(87) PCT Pub. No.: WO2007/007869

PCT Pub. Date: Jan. 18, 2007

(65) Prior Publication Data

US 2009/0121730 A1 May 14, 2009

(30) Foreign Application Priority Data

Jul. 14, 2005 (JP) .............................. 2005-205581

(51) Int. Cl.
*G01R 31/02* (2006.01)
*G01R 31/26* (2006.01)
(52) U.S. Cl. .................... 324/754; 324/757; 324/158.1; 324/724; 439/86; 439/91
(58) Field of Classification Search ......... 324/754–765, 324/724
See application file for complete search history.

(56) References Cited

U.S. PATENT DOCUMENTS

| 6,297,652 | B1 * | 10/2001 | Shimoda et al. ............. 324/754 |
| 6,906,541 | B2 * | 6/2005 | Kimura ....................... 324/754 |
| 2005/0264307 | A1 * | 12/2005 | Setaka ........................ 324/754 |
| 2008/0054921 | A1 | 3/2008 | Kimura et al. |

FOREIGN PATENT DOCUMENTS

| JP | 11 64377 | 3/1999 |
| JP | 2005 121390 | 5/2005 |

OTHER PUBLICATIONS

U.S. Appl. No. 11/815,506, filed Aug. 3, 2007, Kimura, et al.
U.S. Appl. No. 11/914,758, filed Nov. 19, 2007, Kimura, et al.

* cited by examiner

*Primary Examiner*—Ha Tran T Nguyen
*Assistant Examiner*—Emily Y Chan
(74) *Attorney, Agent, or Firm*—Oblon, Spivak, McClelland, Maier & Neustadt, L.L.P.

(57) ABSTRACT

Disclosed are a connector for measurement of electric resistance, by which necessary electrical connection is surely achieved even when a circuit board to be inspected is large in area and has a great number of small-sized electrodes to be inspected, and measurement is surely performed with high precision, and which can be produced at a low cost, and an electric resistance-measuring apparatus and an electric resistance-measuring method for circuit boards, which make use of this connector. The connector for measurement of electric resistance has a first electrode sheet, an anisotropically conductive elastomer sheet arranged on a back surface of the first electrode sheet and having through-holes formed corresponding to the electrodes to be inspected, and a second electrode sheet arranged on a back surface of the anisotropically conductive elastomer sheet. The first electrode sheet has an insulating sheet having through-holes formed corresponding to the electrodes to be inspected, a plurality of ring-like electrodes each formed on a front surface of the insulating sheet so as to surround the through-hole, and junction electrodes formed on a back surface of the insulating sheet, and the second electrode sheet has a plurality of core electrodes for inspection arranged corresponding to the electrodes to be inspected, and a plurality of core electrodes for connection arranged corresponding to the junction electrodes.

10 Claims, 10 Drawing Sheets

(a)

(b)

(c)

(a)

(b)

CONNECTOR FOR MEASURING ELECTRICAL RESISTANCE, AND APPARATUS AND METHOD FOR MEASURING ELECTRICAL RESISTANCE OF CIRCUIT BOARD

TECHNICAL FIELD

The present invention relates to a connector for measurement of electric resistance, and a measuring apparatus and a measuring method of an electric resistance for circuit boards.

BACKGROUND ART

In recent years, with the request for speeding-up of signal transmission in electronic parts and electronic equipments containing such a part therein, there has been a demand for development of those low in electric resistance of wiring between electrodes as circuit boards for fabricating LSI packages such as BGA and CSP or circuit boards, on which these semiconductor devices are mounted. Therefore, it is extremely important to measure the electric resistance of wiring between electrodes of such a circuit board with high precision in electrical inspection of the circuit board.

In the measurement of an electric resistance of a circuit board, there has heretofore been adopted, for example, the four probe method, in which probes PA and PD for current supply and probes PB and PC for voltage measurement are pressed against and brought into respective contact with 2 electrodes 91 and 92 to be inspected, which have been electrically connected to each other in a circuit board 90 to be inspected, as illustrated in FIG. 30, a current is supplied between the probes PA and PD for current supply from a power supply device 93 in this state, and a voltage signal detected by the probes PB and PC for voltage measurement at this time is processed in an electric signal processor 94, thereby finding an electric resistance value between the electrodes 91 and 92 to be inspected.

In the method described above, however, the surfaces of the electrodes 91 and 92 to be inspected may be damaged by pressing the probes PA and PD for current supply and the probes PB and PC for voltage measurement against them because it is necessary to bring the probes into respective contact with the electrodes 91 and 92 to be inspected by considerably high pressing force, the probes are made of a metal, and the tips thereof are pointed. It is therefore impossible to use such a circuit board. Under such circumstances, the measurement of the electric resistance cannot be performed on all circuit boards to be provided as products, and so the method cannot but adopt the so-called sampling inspection. After all, the yield of the products cannot be increased.

In order to solve such a problem, there have heretofore been proposed electric resistance-measuring apparatus, in which connecting members coming into contact with electrodes to be inspected are made up of a conductive elastomer.

For example, (i) Patent Art. 1 discloses an electric resistance-measuring apparatus, in which elastic connecting members formed of conductive rubber obtained by binding conductive particles with an elastomer are arranged at electrodes for current supply and electrodes for voltage measurement, respectively, (ii) Patent Art. 2 discloses an electric resistance-measuring apparatus having a common elastic connecting member provided so as to come into contact with surfaces of both electrode for current supply and electrode for voltage measurement electrically connected to the same electrode to be inspected and formed of an anisotropically conductive elastomer, and (iii) Patent Art. 3 discloses an electric resistance-measuring apparatus comprising a circuit board for inspection, on the surface of which a plurality of inspection electrodes have been formed, and an elastic connecting member provided on the surface of the circuit board for inspection and formed of a conductive elastomer, wherein two electrodes among the inspection electrodes are selected in a state that electrodes to be inspected have been electrically connected to the plurality of inspection electrodes through the connecting member, one of both electrodes is used as an electrode for current supply, and the other is used as an electrode for voltage measurement to measure an electric resistance.

According to such electric resistance-measuring apparatus, the electrodes for current supply and the electrodes for voltage measurement are brought into contact with electrodes to be inspected of a circuit board to be inspected through the elastic connecting member, whereby electrical connection is achieved, so that the measurement of the electric resistance can be conducted without damaging the electrodes to be inspected.

However, the measurement of an electric resistance between electrodes by the electric resistance-measuring apparatus of the constructions (i) and (ii) involve the following problems.

In recent years, the size and pitch of electrodes or an interelectrode distance in a circuit board have tended to become small for the purpose of achieving a high degree of integration. In the electric resistance-measuring apparatus of the constructions (i) and (ii), however, it is necessary to electrically connect both electrodes for current supply and electrodes for voltage measurement at the same time to electrodes to be inspected in a circuit board to be inspected, the electric resistance of which should be measured, through the elastic connecting member, respectively. In the electric resistance-measurement apparatus for measuring an electric resistance as to a circuit board to be inspected, on which small-sized electrodes to be inspected have been arranged at a high density, it is thus necessary to form an electrode for current supply and an electrode for voltage measurement corresponding to each of the small-sized electrodes to be inspected in a state separated from each other in a region of an area equal to or smaller than a region occupied by the electrode to be inspected, i.e., to form an electrode for current supply and an electrode for voltage measurement, which are smaller in size than the electrode to be inspected, in a state separated from each other at an extremely short distance.

On the other hand, in order to improve productivity, it is adopted as a production process of circuit boards to produce a combined circuit board composed of a plurality of circuit boards linked with each other by a board material, collectively conduct electrical inspection as to the respective circuit boards in the combined circuit board in this state and then cut the combined circuit board, thereby producing a plurality of circuit board separated from each other.

However, the area of the combined circuit board, which is an object of inspection, is considerably large, and the number of electrodes to be inspected is also extremely great. When multi-layer circuit boards are produced in particular, the number of steps in the production process thereof increases, and the number of times subjected to thermal hysteresis by a heat treatment increases, so that electrodes to be inspected are often formed in a state misregistered from the prescribed arrangement positions. When measurement of an electric resistance between electrodes is performed as to the circuit board to be inspected, which is large in area and has a great number of electrodes to be inspected formed in a state misregistered from the prescribed arrangement positions as described above, by the electric resistance-measuring apparatus of the constructions (i) and (ii), it is extremely difficult to electrically connect both electrode for current supply and electrode for voltage measurement at the same time to each of the electrodes to be inspected.

Description is given by a specific example. When an electric resistance as to an electrode T to be inspected having a diameter L of 300 μm is measured as shown in FIG. 31, a clearance D between an electrode A for current supply and an electrode V for voltage measurement to be electrically connected to the electrode T to be inspected is about 150 μm. When the position of the electrode T to be inspected to the electrode A for current supply and the electrode V for voltage measurement deviates from the prescribed position shown in FIG. 31 by 75 μm in a direction arranging the electrode A for current supply and the electrode V for voltage measurement in alignment of a circuit board to be inspected as shown in FIGS. 32(a) and 32(b), electrical connection between any one of the electrode A for current supply and the electrode V for voltage measurement and the electrode T to be inspected is not achieved, and so necessary measurement of the electric resistance cannot be conducted.

It is considered as a means for solving such a problem to lessen the clearance D between the electrode A for current supply and the electrode V for voltage measurement to, for example, at most 100 μm. However, it is extremely difficult in fact to produce such an electric resistance-measuring apparatus.

On the other hand, according to the electric resistance-measuring apparatus of the construction (iii), there is no need to form an electrode for current supply and an electrode for voltage measurement corresponding to each of electrodes to be inspected, so that tolerance for positional deviation to a circuit board to be inspected, the electric resistance of which should be measured, becomes high even when the circuit board to be inspected is large in area and has a great number of electrodes to be inspected, and the electrodes to be inspected are small in size and arranged at a high density. In addition, such an electric resistance-measuring apparatus is easily produced.

Since such an electric resistance-measuring apparatus is a measuring apparatus according to the so-called pseudo-four-probe method, however, a measurement error range is great, and it is thus difficult to perform measurement of an electric resistance as to a circuit board low in electric resistance between electrodes with high precision.

In order to solve such a problem, there has been proposed a connector for measurement of electric resistance, which comprises an insulating substrate, and plural pairs of connecting electrodes formed on a front surface of the insulating substrate and each composed of a core electrode and a ring-like electrode arranged so as to surround the core electrode (see Patent Art. 4).

According to such a connector for measurement of electric resistance, at least a part of the ring-like electrode is located on an electrode to be inspected in a circuit board, the electric resistance of which should be measured, so far as alignment is made in such a manner that at least a part of the core electrode is located on the electrode to be inspected. Accordingly, electrical connection of both core electrode and ring-like electrode to the electrode to be inspected is surely achieved even when the circuit board is large in area and has a great number of small-sized electrodes to be inspected, so that measurement of an electric resistance as to the circuit board can be surely performed with high precision by using any one of the core electrode and the ring-like electrode as an electrode for current supply and the other as an electrode for voltage measurement.

However, the above-described connector for measurement of electric resistance involves a problem that the whole structure thereof is complicated to encounter difficulties in producing it at a high yield.

Patent Art. 1: Japanese Patent Application Laid-Open No. 26446/1997
Patent Art. 2: Japanese Patent Application Laid-Open No. 2000-74965
Patent Art. 3: Japanese Patent Application Laid-Open No. 2000-241485
Patent Art. 4: Japanese Patent Application Laid-Open No. 2003-322665

DISCLOSURE OF THE INVENTION

The present invention has been made on the basis of the foregoing circumstances and has as its first object the provision of a connector for measurement of electric resistance, by which necessary electrical connection to a circuit board to be inspected, the electric resistance of which is to be measured, can be surely achieved even when the circuit board to be inspected is large in area and has a great number of small-sized electrodes to be inspected, and expected measurement of electric resistance can be surely performed with high precision, and which can be produced at a low cost.

A second object of the present invention is to provide an electric resistance-measuring apparatus and an electric resistance-measuring method for circuit boards, which make use of the above-described connector for measurement of electric resistance.

A connector for measurement of electric resistance according to the present invention comprises a first electrode sheet, an anisotropically conductive elastomer sheet arranged on a back surface of the first electrode sheet and a second electrode sheet arranged on a back surface of the anisotropically conductive elastomer sheet, wherein the first electrode sheet has a flexible insulating sheet having a plurality of through-holes formed in accordance with a pattern corresponding to a pattern of electrodes to be inspected in a circuit board, the electric resistance of which is to be measured, a plurality of ring-like electrodes each formed on a front surface of the insulating sheet so as to surround the through-hole in the insulating sheet, and junction electrodes each formed on a back surface of the insulating sheet and electrically connected to the ring-like electrode, wherein the anisotropically conductive elastomer sheet has a plurality of through-holes formed in accordance with the pattern corresponding to the pattern of the electrodes to be inspected, wherein the second electrode sheet has a plurality of core electrodes for inspection arranged in accordance with the pattern corresponding to the pattern of the electrodes to be inspected, a plurality of core electrodes for connection arranged in accordance with a pattern corresponding to a pattern of the junction electrodes in the first electrode sheet, and an insulating support sheet supporting the core electrodes for inspection and the core electrodes for connection, and wherein the core electrodes for inspection each enter the through-hole in the anisotropically conductive elastomer sheet and the through-hole in the insulating sheet of the first electrode sheet to be electrically connected to the electrode to be inspected.

Another connector for measurement of electric resistance according to the present invention comprises a first electrode sheet, a first anisotropically conductive elastomer sheet arranged on a front surface of the first electrode sheet, a second anisotropically conductive elastomer sheet arranged on a back surface of the first electrode sheet and a second electrode sheet arranged on a back surface of the second anisotropically conductive elastomer sheet, wherein the first electrode sheet has a flexible insulating sheet having a plurality of through-holes formed in accordance with a pattern corresponding to a pattern of electrodes to be inspected in a circuit board, the electric resistance of which is to be measured, a plurality of ring-like electrodes each formed on a front surface of the insulating sheet so as to surround the through-hole in the insulating sheet, and junction electrodes each formed on a back surface of the insulating sheet and electrically connected to the ring-like electrode, wherein the second anisotropically conductive elastomer sheet has a plurality of through-holes formed in accordance with the pattern corresponding to the pattern of the electrodes to be inspected, wherein the second electrode sheet has a plurality of core electrodes for inspection arranged in accordance with the pattern corresponding to the pattern of the electrodes to be inspected, a plurality of core electrodes for connection arranged in accordance with a pattern corresponding to a pattern of the junction electrodes in the first electrode sheet, and an insulating support sheet supporting the core electrodes for inspection and the core electrodes for connection, and wherein the core electrodes for inspection each enter the through-hole in the second anisotropically conductive elastomer sheet and the through-hole in the insulating sheet of the first electrode sheet to be electrically connected to the electrode to be inspected through the first anisotropically conductive elastomer sheet.

In the connectors for measurement of electric resistance according to the present invention, the core electrodes for inspection and the core electrodes for connection in the second electrode sheet may preferably be provided movably in a thickness-wise direction of the insulating support sheet.

An electric resistance-measuring apparatus for circuit boards according to the present invention comprises one of the above-described connectors for measurement, which is arranged on one surface side of a circuit board to be inspected, the electric resistance of which is to be measured, wherein the ring-like electrode of the first electrode sheet and the core electrode for inspection of the second electrode sheet in the connector for measurement of electric resistance are electrically connected at the same time to each of one surface-side electrodes to be inspected in the circuit board to be inspected, thereby creating a measurable state, and wherein in this measurable state, one of the core electrode for inspection and ring-like electrode electrically connected to one designated one surface-side electrode to be inspected is used as an electrode for current supply, and the other is used as an electrode for voltage measurement, thereby performing measurement of electric resistance related to the designated one surface-side electrode.

The electric resistance-measuring apparatus according to the present invention may preferably comprise an other surface-side circuit board for inspection arranged on the other surface side of the circuit board to be inspected, wherein the other surface-side circuit board for inspection has, on its front surface, an electrode for current supply and an electrode for voltage measurement, which are arranged corresponding to each of the other surface-side electrodes to be inspected of the circuit board to be inspected, formed in a state separated from each other and electrically connected to the same other surface-side electrode to be inspected.

An electric resistance-measuring method for circuit boards according to the present invention comprises arranging one of the above-described connectors for measurement of electric resistance on one surface of a circuit board to be inspected, the electric resistance of which is to be measured, electrically connecting the ring-like electrode of the first electrode sheet and the core electrode for inspection of the second electrode sheet in the connector for measurement of electric resistance at the same time to each of one surface-side electrodes to be inspected in the circuit board to be inspected, thereby creating a measurable state, and using, in this measurable state, one of the core electrode for inspection and ring-like electrode electrically connected to one designated one surface-side electrode to be inspected as an electrode for current supply and the other as an electrode for voltage measurement, thereby performing measurement of electric resistance related to the designated one surface-side electrode.

According to the connectors for measurement of electric resistance of the above-described constructions, the through-holes, in which the core electrodes for inspection in the second electrode sheet respectively enter, are formed in the insulating sheet of the first electrode sheet, and the ring-like electrodes are formed around the respective through-holes so as to respectively surround the through-holes, so that at least a part of the ring-like electrode is located on an electrode to be inspected in a circuit board to be inspected, the electric resistance of which is to be measured, so far as alignment is conducted in such a manner that at least a part of the core electrode for inspection is located on the electrode to be inspected, whereby electrical connection of both core electrodes for inspection and ring-like electrodes to the electrodes to be inspected can be surely achieved even when the circuit board to be inspected is large in area and has a great number of small-sized electrodes to be inspected. In addition, since the core electrodes for inspection and the ring-like electrodes are electrically insulated from each other, an electric resistance as to the circuit board can be measured with high precision by using one of the core electrode for inspection and the ring-like electrode, which are electrically connected to the electrode to be inspected, as an electrode for current supply and the other as an electrode for voltage measurement.

Further, since the first electrode sheet and second electrode sheet each have a simple structure, the connectors for measurement of electric resistance can be produced at a low cost as a whole. Accordingly, inspection cost can be reduced in the measurement of an electric resistance of a circuit board.

DESCRIPTION OF CHARACTERS

Figure 1:
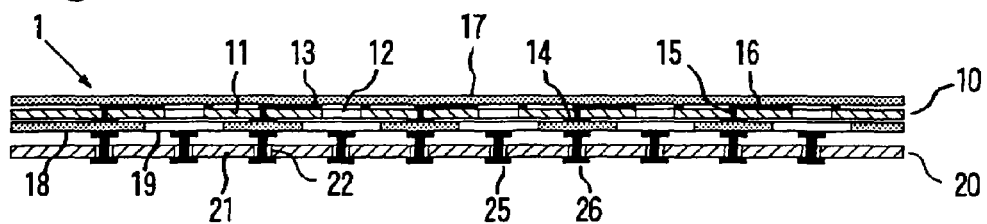
FIG. 1 is a cross-sectional view illustrating the construction of an exemplary connector for measurement of electric resistance according to the present invention.

1 Connector for measurement of electric resistance
2 Holder
3 Positioning pins
5 Circuit board to be inspected
6 One surface-side electrodes to be inspected
7 Other surface-side electrodes to be inspected
8a, 8b Circuits
10 First electrode sheet
10A Laminate material
10H Through-holes
11 Insulating sheet
12 Through-holes
13 Ring-like electrodes
14 Junction electrodes
15 Short circuit parts
16 Wiring parts
16A Metal layer
17 First anisotropically conductive elastomer sheet
17A Layer of material for conductive elastomer
17B Material for conductive elastomer
18 Second anisotropically conductive elastomer sheet
19 Through-holes
20 Second electrode sheet
20A Composite laminate material
20B Laminate material
21 Insulating support sheet
22 Through-holes
23A Metal layer
23B Thin metal layers
23K openings
24 Resist films
24K Pattern holes
25 Core electrodes for inspection
25a Body parts
25b Terminal parts
26 Core electrodes for connection
26a Body parts
26b Terminal parts
30 One surface-side molding material
31 Other surface-side molding material
32 Spacer
32K Opening
33 Press roll 34 Support roll
35 Press roll device
40 Connector for measurement of electric resistance
41 Circuit board for inspection
42a Electrodes for current supply
42b Electrodes for voltage measurement
43 Terminal electrodes
45 Anisotropically conductive elastomer layer
46 Conductive path-forming parts
47 Insulating part
50a Upper-side inspection head
50b Lower-side inspection head
51a, 51b Inspection electrode devices
52a, 52b Electrode pins
53a, 53b Electric wires
54a, 54b Support posts
55a, 55b Anisotropically conductive sheets
56a Upper-side support plate
56b Lower-side support plate
57a, 57b Connectors
90 Circuit board to be inspected
91, 92 Electrodes to be inspected
93 Power supply device
94 Electric signal processor
PA, PD Probes for current supply
PB, PC Probes for voltage measurement
A Electrode for current supply
V Electrode for voltage measurement
T Electrode to be inspected
P Conductive particles
Z Notches

BEST MODE FOR CARRYING OUT THE INVENTION

The embodiments of the present invention will hereinafter be described in detail.

<Connector for Measurement of Electric Resistance>

FIG. 1 is a cross-sectional view illustrating the construction of an exemplary connector for measurement of electric resistance according to the present invention. This connector 1 for measurement of electric resistance is used for measuring an electric resistance between electrodes in a circuit board and constructed by a first electrode sheet 10, a first anisotropically conductive elastomer sheet 17 arranged on a front surface of the first electrode sheet 10, a second anisotropically conductive elastomer sheet 18 arranged on a back surface of the first electrode sheet 10 and a second electrode sheet 20 arranged on a back surface of the second anisotropically conductive elastomer sheet 18.

Figure 2:
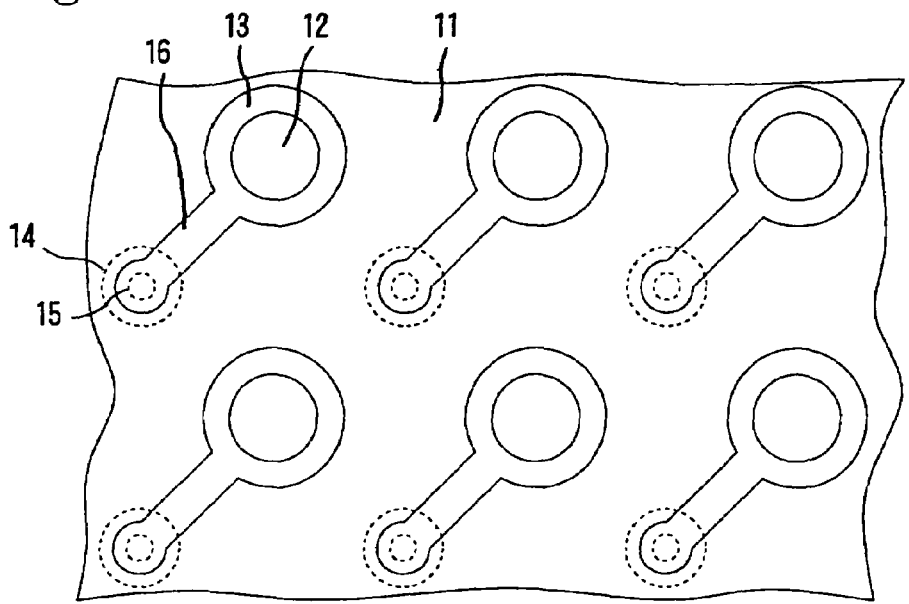
FIG. 2 is a plan view illustrating, on an enlarged scale, a principal part of a first electrode sheet in the connector for measurement of electric resistance shown in FIG. 1.
Figure 3:
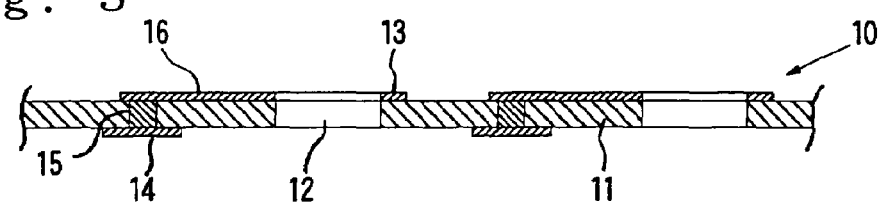
FIG. 3 is a cross-sectional view illustrating, on an enlarged scale, the principal part of the first electrode sheet in the connector for measurement of electric resistance shown in FIG. 1.

FIG. 2 is a plan view illustrating, on an enlarged scale, a principal part of the first electrode sheet 10, and FIG. 3 is a cross-sectional view illustrating, on an enlarged scale, the principal part of the first electrode sheet 10. This first electrode sheet 10 has a flexible insulating sheet 11, in which a plurality of through-holes 12 have been formed in accordance with a pattern corresponding to a pattern of electrodes to be inspected in a circuit board (hereinafter referred to as "circuit board to be inspected"), the electric resistance of which is to be measured. On a front surface of the insulating sheet 11, a plurality of ring-like electrodes 13 are formed so as to surround the respective through-holes 12 in the insulating sheet 11. On a back surface of the insulating sheet 11, junction electrodes 14 are formed in accordance with a proper pattern. In the illustrated embodiment, each of the junction electrodes 14 is arranged so as to be located at a middle position between the through-holes 12 in the insulating sheet 11. Each of the junction electrodes 14 is also electrically connected to the ring-like electrode 13 through a short circuit part 15 extending through in a thickness-wise direction of the insulating sheet 11 and a wiring part 16 formed on the front surface of the insulating sheet 11.

As a material for forming the insulating sheet 11, a resin material having high mechanical strength is preferably used, and specific examples thereof include liquid crystal polymers and polyimide.

As a material for forming the ring-like electrodes 13, junction electrode 14, short circuit parts 15 and wiring parts 16, may be used copper, nickel, gold or a laminate of these metals.

No particular limitation is imposed on the thickness of the insulating sheet 11 so far as the insulating sheet 11 has flexibility. However, the thickness is preferably, for example, 5 to 50 µm, more preferably 8 to 30 µm.

The diameter of each through-hole 12 in the insulating sheet 11 may be any size so far as a core electrode 25 for inspection in the second electrode sheet 20, which will be described subsequently, can be movably inserted therein. However, the diameter is preferably, for example, 1.05 to 2 times, more preferably 1.1 to 1.7 times as much as the diameter of the core electrode 25 for inspection.

The inner diameter of each ring-like electrode 13 is preset according to the diameter of an electrode to be inspected electrically connected to the ring-like electrode 13 and is preferably 50 to 110%, more preferably 70 to 100% of the diameter of the electrode to be inspected in that electrical connection to the electrode to be inspected can be surely achieved.

The inner diameter of the ring-like electrode 13 is preferably 1.1 to 2 times, more preferably 1.2 to 1.7 times as much as the diameter of the core electrode 25 for inspection from the viewpoint of surely retaining the insulating property from the core electrode 25 for inspection in the second electrode sheet 20, which will be described subsequently.

Figure 4:
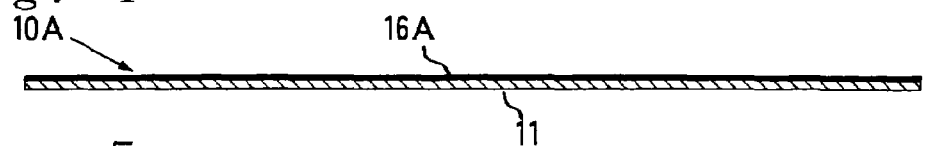
FIG. 4 is a cross-sectional view illustrating a laminate material for obtaining the first electrode sheet.
Figure 5:
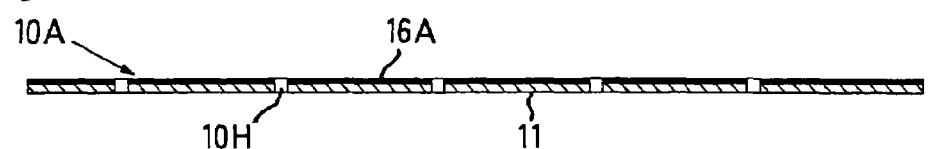
FIG. 5 is a cross-sectional view illustrating a state that through-holes have been formed in the laminate material.
Figure 6:
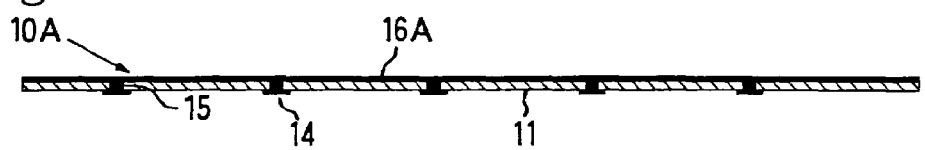
FIG. 6 is a cross-sectional view illustrating a state that junction electrodes and short circuit parts have been formed on and in an insulating sheet of the laminate material.
Figure 7:
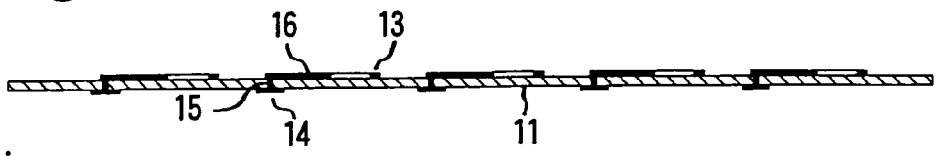
FIG. 7 is a cross-sectional view illustrating a state that ring-like electrodes and wiring parts have been formed on the insulating sheet of the laminate material.

Such a first electrode sheet 10 can be produced, for example, in the following manner. A laminate material 10A obtained by forming a metal layer 16A on a front surface of an insulating sheet 11 is first provided as illustrated in FIG. 4, and a plurality of through-holes 10H each extending through in respective thickness-wise directions of the insulating sheet 11 and the metal layer 16A are formed in accordance with a pattern of short circuit parts 15 to be formed in the first electrode sheet 10 as illustrated in FIG. 5. The laminate material 10A, in which the through-holes 10H have been formed, is then subjected to photolithography and plating treatment, thereby forming junction electrodes 14 on a back surface of the insulating sheet 11 and moreover forming short circuit parts 15 each electrically connecting the junction electrode 14 to the metal layer 16A and extending through in the thickness-wise direction of the insulating sheet 11 as illustrated in FIG. 6. Thereafter, the metal layer 16A is subjected to photolithography and etching treatment to remove a part thereof, thereby forming ring-like electrodes 13 and wiring parts 16 on a front surface of the insulating sheet 11 as illustrated in FIG. 7. The ring-like electrodes 13 are used as a mask to subject the insulating sheet 11 to laser beam machining, thereby forming through-holes 12 in the insulating sheet 11, thus obtaining the first electrode sheet 10.

Figure 8:
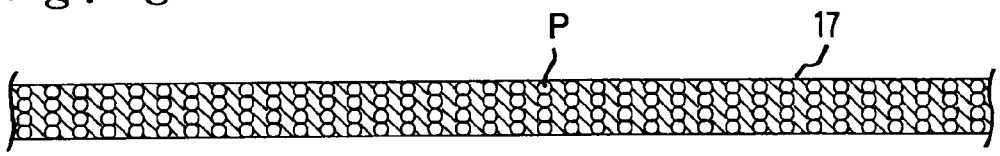
FIG. 8 is a cross-sectional view illustrating, on an enlarged scale, a principal part of a first anisotropically conductive elastomer sheet.

FIG. 8 is a cross-sectional view illustrating, on an enlarged scale, a part of the first anisotropically conductive elastomer sheet 17. This first anisotropically conductive elastomer sheet 17 is obtained by causing conductive particles P exhibiting magnetism to be contained in an insulating elastic polymeric substance in a state oriented so as to align in a thickness-wise direction of the sheet to form chains and in a state that the chains by the conductive particles P have been distributed in a plane direction of the sheet. As the elastic polymeric substance forming the first anisotropically conductive elastomer sheet 17, is preferred a polymeric substance having a crosslinked structure. Various materials may be used as curable polymeric substance-forming materials usable for obtaining such elastic polymeric substances. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber and ethylene-propylene-diene terpolymer rubber. Among these, silicone rubber is preferably used from the viewpoints of durability, molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those containing a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of a weight average molecular weight Mw as determined in terms of standard polystyrene to a number average molecular weight Mn as determined in terms of standard polystyrene; the same shall apply hereinafter) of at most 2 in that good heat resistance is brought into the resulting anisotropically conductive elastomer sheet.

As the conductive particles P contained in the first anisotropically conductive elastomer sheet 17, those exhibiting magnetism are used in that such conductive particles can be easily oriented so as to align in the thickness-wise direction by a method, which will be described subsequently. Specific examples of such conductive particles include particles of metals having magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, and particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold having good conductivity are preferably used.

No particular limitation is imposed on a means for coating the surfaces of the core particles with the conductive metal. However, for example, a chemical plating, electroplating, sputtering or vapor deposition process is used.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% in that good conductivity is achieved.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The number average particle diameter of the conductive particles P is preferably 3 to 20 μm, more preferably 5 to 15 μm. If this number average particle diameter is too small, it may be difficult in some cases to orient the conductive particles P in the thickness-wise direction in a production process, which will be described subsequently. If this number average particle diameter is too great on the other than, it may be difficult in some cases to obtain an anisotropically conductive elastomer sheet having high resolving power.

The particle diameter distribution (Dw/Dn) of the conductive particles P is preferably 1 to 10, more preferably 1.01 to 7, still more preferably 1.05 to 5, particularly preferably 1.1 to 4.

No particular limitation is imposed on the form of the conductive particles P. However, they are preferably in the form of a sphere or star, or secondary particles obtained by aggregating these particles in that such particles can be easily dispersed in the polymeric substance-forming material.

Those obtained by treating surfaces of the particles with a coupling agent such as a silane coupling agent, or a lubricant may be suitably used as the conductive particles P. By treating the surfaces of the particles with the coupling agent or lubricant, the durability of the resulting anisotropically conductive elastomer sheet is improved.

Such conductive particles P are preferably contained in a proportion of 10 to 40%, particularly 15 to 35% in terms of volume fraction in the anisotropically conductive elastomer sheet. If this proportion is too low, an anisotropically conductive elastomer sheet having sufficiently high conductivity in the thickness-wise direction may not be obtained in some cases. If this proportion is too high on the other hand, the resulting anisotropically conductive elastomer sheet is liable to become brittle, so that elasticity required of the anisotropically conductive elastomer sheet may not be achieved in some cases.

The thickness of the first anisotropically conductive elastomer sheet 17 is preferably 10 to 100 μm, more preferably 15 to 70 μm. If this thickness is too small, sufficient irregularity-absorbing ability may not be achieved in some cases. If this thickness is too great on the other hand, high resolving power may not be obtained in some cases.

The first anisotropically conductive elastomer sheet 17 can be produced in the following manner.

Figure 9:
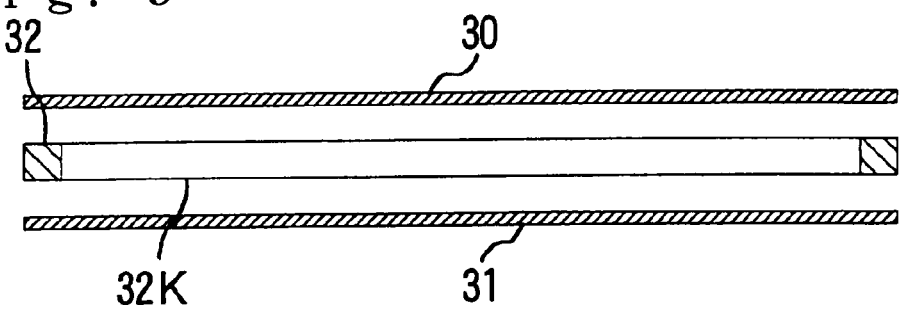
FIG. 9 is a cross-sectional view illustrating a one surface-side molding member, an other surface-side molding member and a spacer for producing the first anisotropically conductive elastomer sheet.

As illustrated in FIG. 9, a one surface-side molding member 30 and an other surface-side molding member 31, which are each in a sheet form, and a frame-like spacer 32, which has an opening 32K having a shape fitted to a plane shape of the intended first anisotropically conductive elastomer sheet 17 and a thickness corresponding to the thickness of the first anisotropically conductive elastomer sheet 17, are first provided, and on the other hand, a material for conductive elastomer with conductive particles contained in a liquid polymeric substance-forming material, which will become an elastic polymeric substance by being cured, is prepared.

Figure 10:
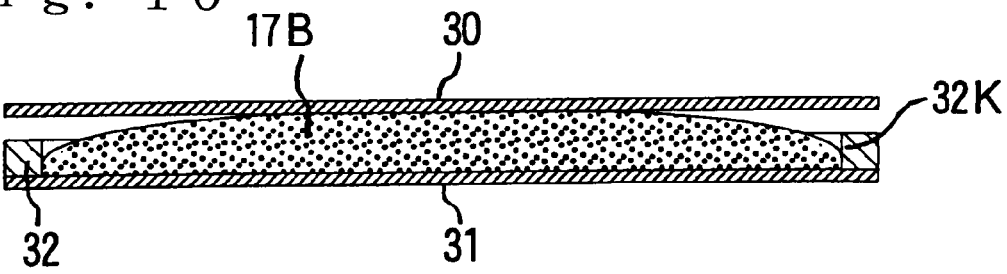
FIG. 10 is a cross-sectional view illustrating a state that a material for conductive elastomer has been applied on to the surface of the other surface-side molding member.

As illustrated in FIG. 10, the spacer 32 is arranged on a molding surface (upper surface in FIG. 10) of the other surface-side molding member 31, the prepared material 17B for conductive elastomer is applied to within the opening 32K of the spacer 32 on the molding surface of the other surface-side molding member 31, and the one surface-side molding member 30 is then arranged on this material 17B for conductive elastomer in such a manner that the molding surface (lower surface in FIG. 10) thereof comes into contact with the material 17B for conductive elastomer.

In the above-described process, resin sheets formed of a polyimide resin, polyester resin, acrylic resin or the like may be used as the one surface-side molding member 30 and other surface-side molding member 31.

The thickness of each of the resin sheets making up the one surface-side molding member 30 and other surface-side molding member 31 is preferably 50 to 500 µm, more preferably 75 to 300 µm. If this thickness is smaller than 50 µm, strength required of the molding member may not be achieved in some cases. If this thickness exceeds 500 µm on the other hand, it may be difficult in some cases to apply a magnetic field of necessary intensity to a layer of the material for conductive elastomer, which will be described subsequently.

Figure 11:
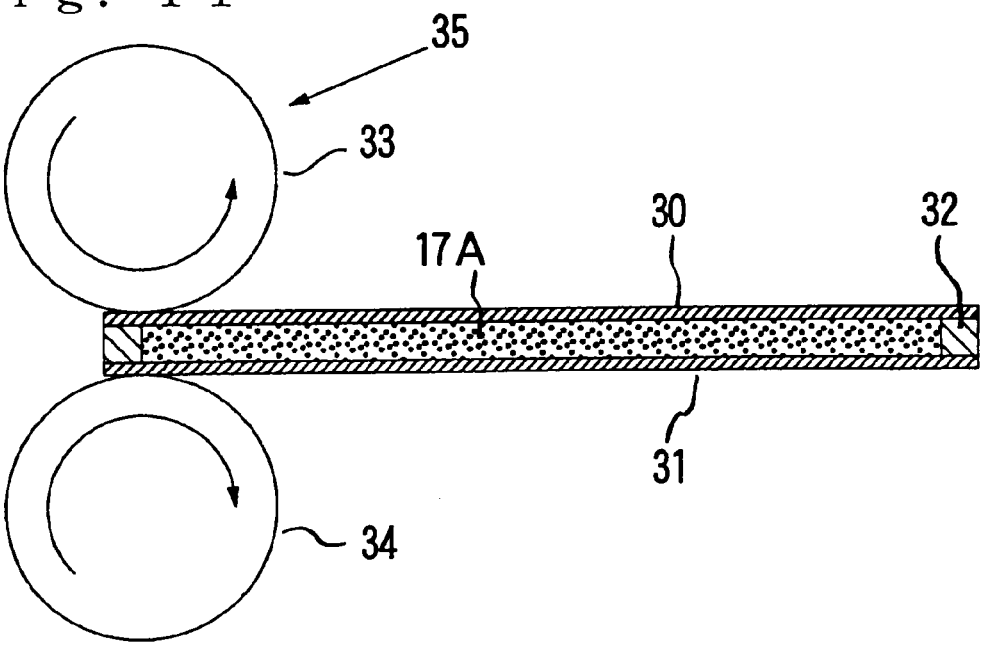
FIG. 11 is a cross-sectional view illustrating a state that a layer of the material for conductive elastomer has been formed between the one surface-side molding member and the other surface-side molding member.
Figure 12:
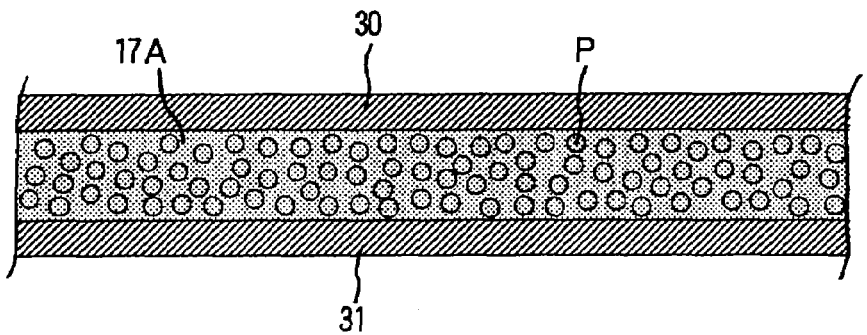
FIG. 12 is a cross-sectional view illustrating, on an enlarged scale, the layer of the material for conductive elastomer shown in FIG. 11.

As illustrated in FIG. 11, a press roll device 35 composed of a press roll 33 and a support roll 34 is then used to pinch the material 17B for conductive elastomer by the one surface-side molding member 30 and the other surface-side molding member 31, thereby forming a layer 17A of the material for conductive elastomer having a necessary thickness between the one surface-side molding member 30 and the other surface-side molding member 31. In this layer 17A of the material for conductive elastomer, as illustrated on an enlarged scale in FIG. 12, the conductive particles P are contained in an evenly dispersed state.

Figure 13:
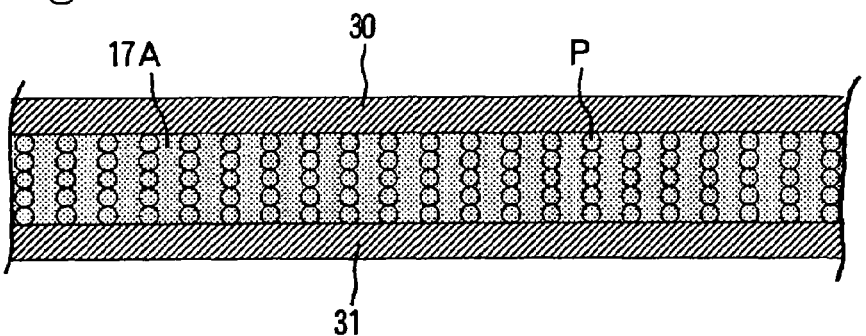
FIG. 13 is a cross-sectional view illustrating a state that a magnetic field has been applied to the layer of the material for conductive elastomer shown in FIG. 11 in a thickness-wise direction thereof.

For example, a pair of electromagnets are then arranged on a back surface of the one surface-side molding member 30 and a back surface of the other surface-side molding member 31, and the electromagnets are operated, thereby applying a parallel magnetic field to the layer 17A of the material for conductive elastomer in its thickness-wise direction. As a result, in the layer 17A of the material for conductive elastomer, the conductive particles P dispersed in the layer 17A of the material for conductive elastomer are oriented so as to align in the thickness-wise direction while retaining the state dispersed in the plane direction as illustrated in FIG. 13, whereby a plurality of chains each composed of the conductive particles P and extending in the thickness-wise direction are formed in the state distributed in the plane direction.

In this state, the layer 17A of the material for conductive elastomer is then subjected to a curing treatment, thereby producing the first anisotropically conductive elastomer sheet 17 containing the conductive particles P in a state that the conductive particles P have been oriented so as to align in the thickness-wise direction in the elastic polymeric substance and in a state that the chains formed of the conductive particles P have been distributed in the plane direction.

In the above-described process, the curing treatment of the layer 17A of the material for conductive elastomer may be conducted in the state that the parallel magnetic field has been applied. However, the treatment may also be conducted after stopping the application of the parallel magnetic field.

The intensity of the parallel magnetic field applied to the layer 17A of the material for conductive elastomer is preferably an intensity that it amounts to 0.02 to 2.0 T on the average.

The curing treatment of the layer 17A of the material for conductive elastomer is suitably selected according to the material used. However, the treatment is generally conducted by a heat treatment. Specific heating temperature and heating time are suitably selected in view of the kinds of the polymeric substance-forming material forming the layer 17A of the material for conductive elastomer, and the like, the time required for movement of the conductive particles P, and the like.

Figure 14:
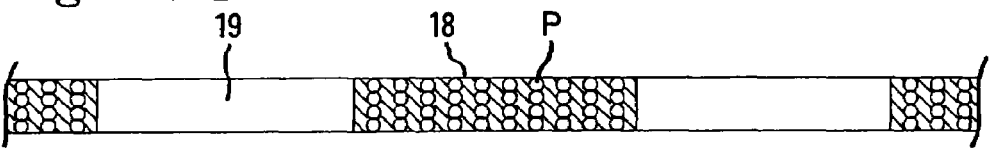
FIG. 14 is a cross-sectional view illustrating, on an enlarged scale, a principal part of a second anisotropically conductive elastomer sheet.

FIG. 14 is a cross-sectional view illustrating, on an enlarged scale, a principal part of a second anisotropically conductive elastomer sheet. This second anisotropically conductive elastomer sheet 18 is obtained by causing conductive particles P exhibiting magnetism to be contained in an insulating elastic polymeric substance in a state oriented so as to align in a thickness-wise direction of the sheet to form chains and in a state that the chains by the conductive particles P have been distributed in a plane direction of the sheet, and fundamentally has the same construction as the first anisotropically conductive elastomer sheet 17 except that a plurality of through-holes 19 each extending through in the thickness-wise direction are formed. The through-holes 19 in the second anisotropically conductive elastomer sheet 18 are formed in accordance with the pattern corresponding to the pattern of the electrodes to be inspected in the circuit board to be inspected.

The diameter of each through-hole 19 in the second anisotropically conductive elastomer sheet 18 may be any size so far as a core electrode 25 for inspection in the second electrode sheet 20, which will be described subsequently, can be movably inserted therein. However, the diameter is preferably, for example, 1.1 to 2 times, more preferably 1.2 to 1.7 times as much as the diameter of the core electrode 25 for inspection.

Such a second anisotropically conductive elastomer sheet 18 is obtained by producing an anisotropically conductive elastomer sheet by the same process as in the first anisotropically conductive elastomer sheet 17 and then subjecting the anisotropically conductive elastomer sheet to, for example, laser beam machining, thereby forming the through-holes 19.

Figure 15:
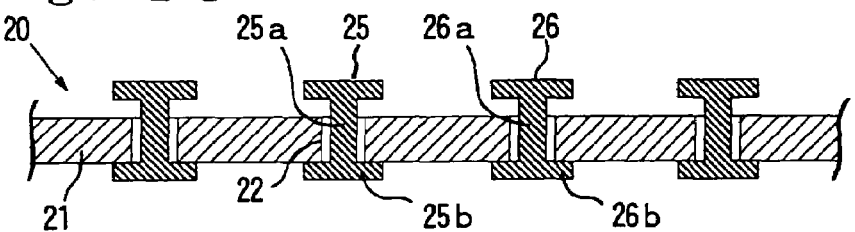
FIG. 15 is a cross-sectional view illustrating, on an enlarged scale, a principal part of a second electrode sheet.

FIG. 15 is a cross-sectional view illustrating, on an enlarged scale, a principal part of the second electrode sheet 20. This second electrode sheet 20 is constructed by a plurality of core electrodes 25 for inspection arranged in accordance with the pattern corresponding to the pattern of electrodes to be inspected in the circuit board to be inspected, a plurality of core electrodes 26 for connection arranged in accordance with a pattern corresponding to a pattern of the junction electrodes 14 in the first electrode sheet 10, and an insulating support sheet 21 supporting the core electrodes 25 for inspection and the core electrodes 26 for connection. Specifically, in the insulating support sheet 21, a plurality of through-holes 22 each extending through in a thickness-wise direction of the sheet are formed in accordance with the pattern corresponding to the pattern of the electrodes to be inspected in the circuit board to be inspected and the pattern corresponding to the pattern of the junction electrodes 14 in the first electrode sheet 10, and the core electrodes 25 for inspection and the core electrodes 26 for connection are respectively arranged in the through-holes 21 in this insulating support sheet 21 so as to protrude from both surfaces of the insulating support sheet 21.

Each of the core electrodes 25 for inspection is formed by a columnar body part 25a inserted through the through-hole 22 in the insulating support sheet 21, and terminal parts 25b respectively linked and formed integrally with both ends of this body part 25a and exposed to the surfaces of the insulating support sheet 21. The length of the body part 25a in each core electrode 25 for inspection is greater than the thickness of the insulating support sheet 21, and the diameter of the body part 25a is smaller than the diameter of the through-hole 22 in the insulating support sheet 21, whereby the core electrode 25 for inspection is movable in the thickness-wise direction of the insulating support sheet 21. The diameter of each terminal part 25b in the core electrode 25 for inspection is greater than the diameter of the through-hole 22 in the insulating support sheet 21.

Each of the core electrodes 26 for connection is formed by a columnar body part 26a inserted through the through-hole 22 in the insulating support sheet 21, and terminal parts 26b respectively linked and formed integrally with both ends of this body part 26a and exposed to the surfaces of the insulating support sheet 21. The length of the body part 26a in each core electrode 26 for connection is greater than the thickness of the insulating support sheet 21, and the diameter of the body part 26a is smaller than the diameter of the through-hole 22 in the insulating support sheet 21, whereby the core electrode 26 for connection is movable in the thickness-wise direction of the insulating support sheet 21. The diameter of each terminal part 26b in the core electrode 26 for connection is greater than the diameter of the through-hole 22 in the insulating support sheet 21.

As a material for forming the insulating support sheet 21, may be used a resin material such as a liquid crystal polymer, polyimide resin, polyester resin, polyaramide resin or polyamide resin, a fiber-reinforced resin material such as a glass fiber-reinforced epoxy resin, glass fiber-reinforced polyester resin or glass fiber-reinforced polyimide resin, or a composite resin material with an inorganic material such as alumina or boron nitride contained as a filler in an epoxy resin or the like.

The thickness of the insulating support sheet 21 is preferably 10 to 200 µm, more preferably 15 to 100 µm.

The diameter of each of the through-holes 22 in the insulating support sheet 21 is preferably 20 to 80 µm, more preferably 30 to 60 µm.

As a material for forming the core electrodes 25 for inspection and the core electrodes 26 for connection, may be suitably used a metallic material having rigidity. In particular, a material harder to be etched than a thin metal layer formed on the insulating support sheet 21 in a production process, which will be described subsequently, is preferably used. As specific examples of such a metallic material, may be mentioned simple metals such as nickel, cobalt, gold and aluminum, and alloys of these metals.

The diameter r2 of the body part 25a or 26a in each of the core electrodes 25 for inspection and the core electrodes 26 for connection is preferably at least 18 µm, more preferably at least 25 µm. If this diameter is too small, necessary strength required of the core electrodes 25 for inspection and the core electrodes 26 for connection may not be achieved in some cases. A difference between the diameter of the through-hole 22 in the insulating support sheet 21 and the diameter of the body part 25a or 26a in each of the core electrodes 25 for inspection and the core electrodes 26 for connection is preferably at least 1 µm, more preferably at least 2 µm. If this difference is too small, it may be difficult in some cases to move the core electrodes 25 for inspection and the core electrodes 26 for connection in the thickness-wise direction of the insulating support sheet 21.

The diameter of each of the terminal parts 25b or 26b in each of the core electrodes 25 for inspection and the core electrodes 26 for connection is preferably 70 to 150% of the diameter of the electrode to be inspected. A difference between the diameter of each of the terminal parts 25b or 26b in each of the core electrodes 25 for inspection and the core electrodes 26 for connection, and the diameter of the through-hole 22 in the insulating support sheet 21 is preferably at least 5 µm, more preferably at least 10 µm. If this difference is too small, the core electrodes 25 for inspection and the core electrodes 26 for connection may possibly fall off from the insulating support sheet 21.

A movable distance of each of the core electrodes 25 for inspection and the core electrodes 26 for connection in the thickness-wise direction of the insulating support sheet 21, i.e., a difference between the length of the body part 25a or 26a in each of the core electrodes 25 for inspection and the core electrodes 26 for connection and the thickness of the insulating support sheet 21, is preferably 5 to 50 µm, more preferably 8 to 40 µm. If this movable distance is too small, it may be difficult in some cases to achieve sufficient irregularity-absorbing ability. If this movable distance is too great on the other hand, the length of the body part 25a or 26a in each of the core electrodes 25 for inspection and the core electrodes 26 for connection, which is exposed from the through-hole 22 in the insulating support sheet 21 becomes great, so that the body part 25a or 26a in each of the core electrodes 25 for inspection and the core electrodes 26 for connection may possibly be buckled or damaged when such a second electrode sheet is used in inspection.

The above-described second electrode sheet 20 can be produced, for example, in the following manner.

Figure 16:
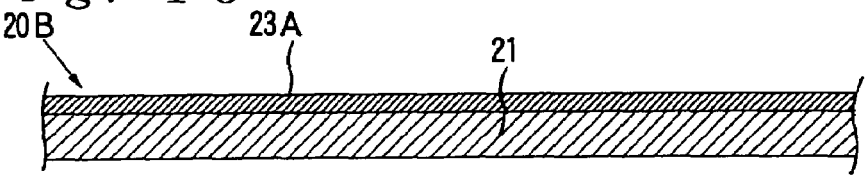
FIG. 16 is a cross-sectional view illustrating the construction of a laminate material for producing the second electrode sheet.
Figure 17:
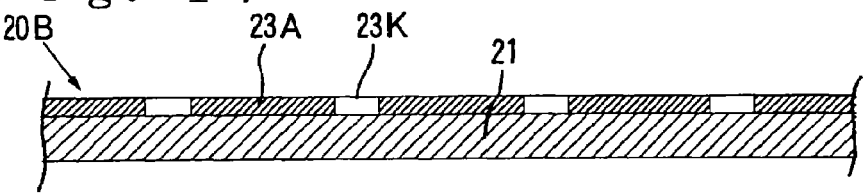
FIG. 17 is a cross-sectional view illustrating a state that openings have been formed in a metal layer of the laminate material.
Figure 18:
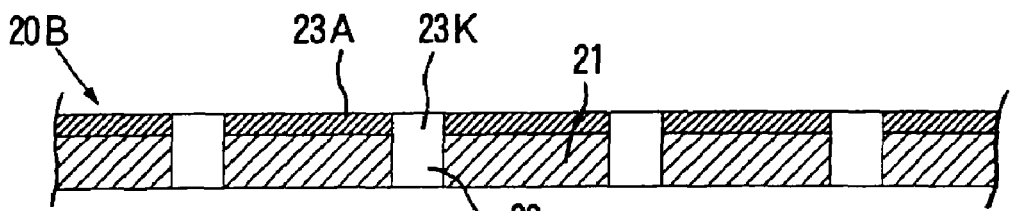
FIG. 18 is a cross-sectional view illustrating a state that through-holes have been formed in an insulating support sheet of the laminate material.
Figure 19:
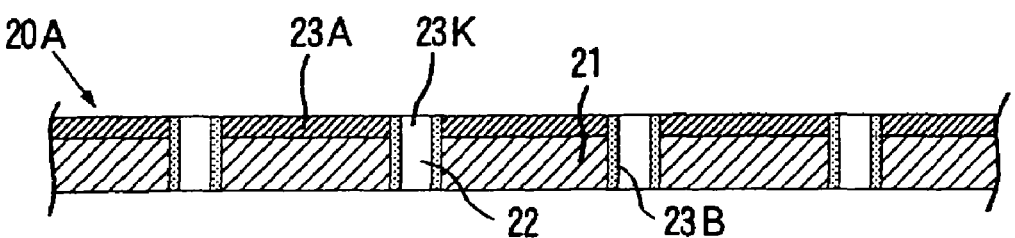
FIG. 19 is a cross-sectional view illustrating the construction of a composite laminate material.

A laminate material 20B obtained by integrally laminating an easily etchable metal layer 23A on one surface of an insulating support sheet 21 is first provided as illustrated in FIG. 16, and the metal layer 23A in this laminate material 20B is subjected to an etching treatment to remove a part thereof, thereby forming a plurality of openings 23K in the metal layer 23A in accordance with a pattern corresponding to a pattern of electrodes to be connected as illustrated in FIG. 17. Through-holes 22 respectively linked to the openings 23K in the metal layer 23A and each extending in a thickness-wise direction of the insulating sheet are then formed in the insulating support sheet 21 in the laminate material 20B as illustrated in FIG. 18. Easily etchable cylindrical thin metal layers 23B are then formed so as to cover the inner wall surfaces of the through-holes 22 in the insulating support sheet 21 and the opening edges of the metal layer 23A as illustrated in FIG. 19. In such a manner, a composite laminate material 20A having the insulating sheet 21, in which a plurality of the through-holes 22 each extending in the thickness-wise direction have been formed, the easily etchable metal layer 23A laminated on one surface of the insulating support sheet 21 and having a plurality of the openings 23K respectively linked to the through-holes 22 in the insulating support sheet 21, and the easily etchable thin metal layers 23B each formed so as to cover the inner wall surface of the through-hole 22 in the insulating support sheet 21 and the opening edge of the metal layer 23A is produced.

In the above-described process, as a method for forming the through-holes 22 in the insulating support sheet 21, may be used a laser beam machining method, drill machining method, etching method or the like.

As an easily etchable metallic material for forming the metal layer 23A and the thin metal layers 23B, may be used copper, nickel or the like.

The thickness of the metal layer 23A is preset in view of the intended movable distance of each of the core electrodes 25 for inspection and the core electrodes 26 for connection, or the like. Specifically, the thickness is preferably 5 to 50 µm, more preferably 8 to 40 µm.

The thickness of each thin metal layer 23B is preset in view of the diameter of the through-hole 22 in the insulating support sheet 21 and the diameter of the body part 25a or 26a in each of the core electrodes 25 for inspection and the core electrodes 26 for connection to be formed.

As a method for forming the thin metal layers 23B, may be used an electroless plating method or the like.

Figure 20:
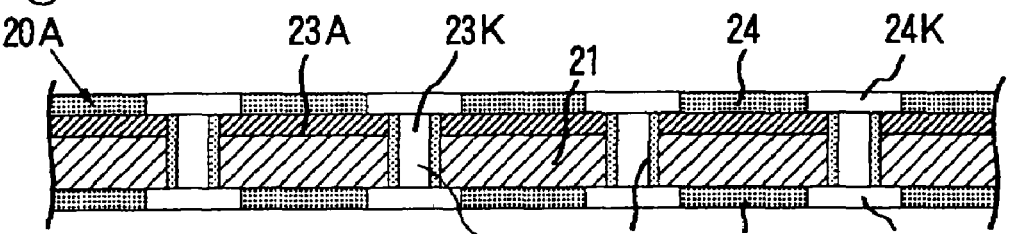
FIG. 20 is a cross-sectional view illustrating a state that resist films have been formed on the composite laminate material.
Figure 21:
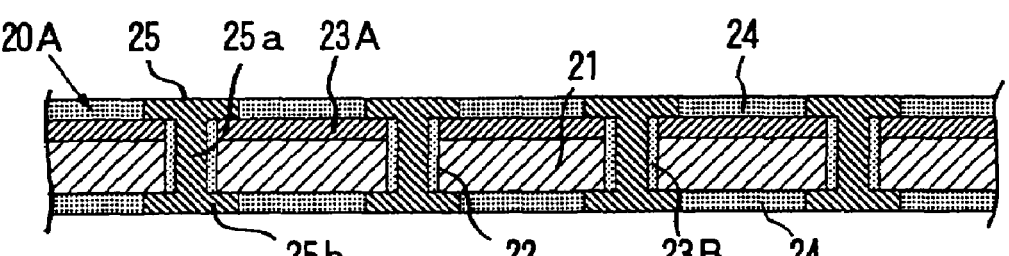
FIG. 21 is a cross-sectional view illustrating a state that core electrodes for inspection and core electrodes for connection have been formed in the through-holes in the insulating support sheet of the composite laminate material.

This composite laminate material 20A is then subjected to a photo-plating treatment, thereby forming the core electrodes 25 for inspection and the core electrodes 26 for connection in the respective through-holes 22 in the insulating support sheet 21. Specifically, resist films 24, in which a plurality of pattern holes 24K respectively linked to the through-holes 22 in the insulating support sheet 21 have been formed in accordance with a pattern corresponding to a pattern of terminal parts 25b and 26b in the core electrodes 25 for inspection and the core electrodes 26 for connection to be formed, are respectively formed on the surface of the metal layer 23A formed on one surface of the insulating support sheet 21 and the other surface of the insulating support sheet 21 as illustrated in FIG. 20. An electroplating treatment is then conducted by using the metal layer 23A as a common electrode to deposit a metal on exposed portions in the metal layer 23A and the surfaces of the thin metal layers 23B so as to fill the metal into the through-holes 22 in the insulating support sheet 21 and the pattern holes 24K in the resist films 24, thereby forming the core electrodes 25 for inspection and the core electrodes 26 for connection each extending in the thickness-wise direction of the insulating support sheet 21 as illustrated in FIG. 21.

Figure 22:
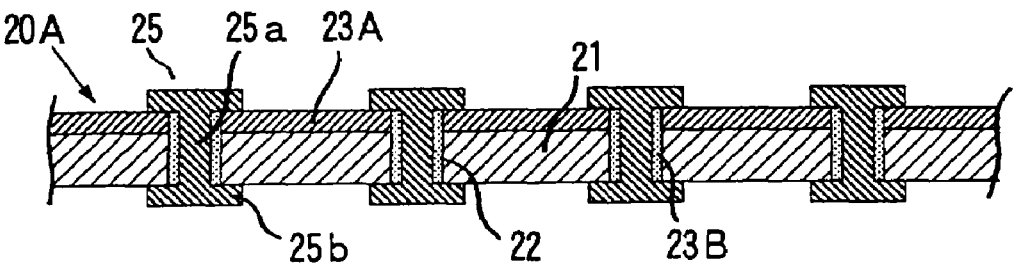
FIG. 22 is a cross-sectional view illustrating a state that the resist films have been removed from the composite laminate material.

After the core electrodes 25 for inspection and the core electrodes 26 for connection are formed in such a manner, the resist film 24 is removed from the surface of the metal layer 23A, thereby exposing the metal layer 23A as illustrated in FIG. 22. An etching treatment is then conducted to remove the metal layer 23A, thereby obtaining the second electrode sheet 20.

Figure 23:
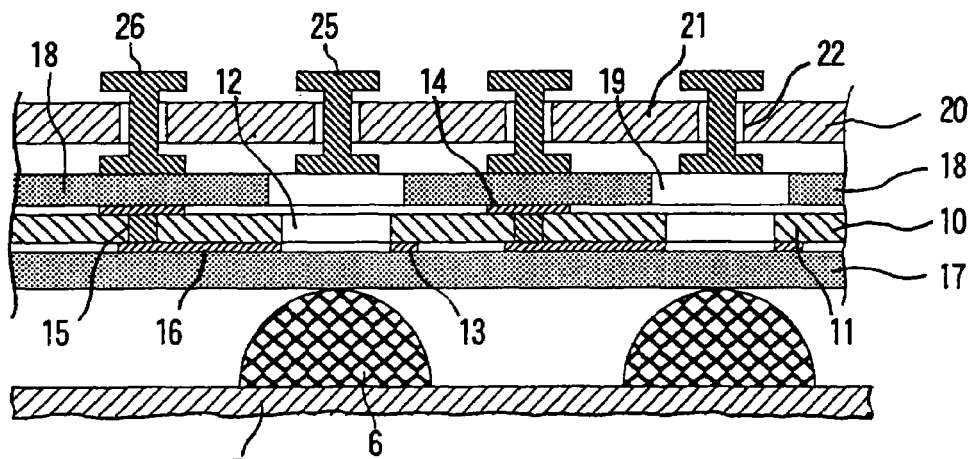
FIG. 23 is a cross-sectional view illustrating a state that the connector for measurement of electric resistance according to the present invention has been arranged on one surface of a circuit board to be inspected.
Figure 24:
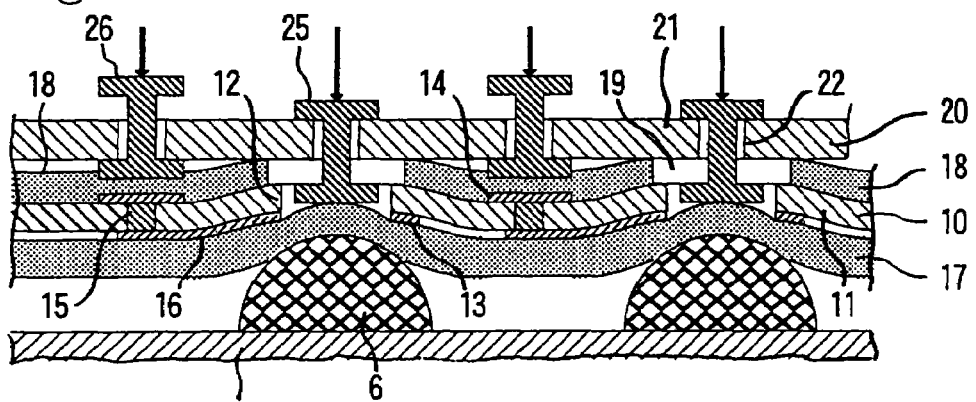
FIG. 24 is a cross-sectional view illustrating a state that the connector for measurement of electric resistance has been pressed.

The above-described connector 1 for measurement of electric resistance is arranged over one surface of a circuit board 5 to be inspected in such a manner that the respective core electrodes 25 for inspection in the connector 1 for measurement of electric resistance are located at respective one surface-side electrodes 6 to be inspected of the circuit board 5 to be inspected as illustrated in FIG. 23, and the connector 1 for measurement of electric resistance is pressed by a proper means. In this state, each of the ring-like electrodes 13 in the first electrode sheet 10 is electrically connected to its corresponding one surface-side electrode 6 to be inspected of the circuit board 5 to be inspected through the first anisotropically conductive elastomer sheet 17 as illustrated in FIG. 24. Each of the core electrodes 25 for inspection in the second electrode sheet 20 enters the through-hole 19 in the second anisotropically conductive elastomer sheet 18 and the through-hole 12 in the first electrode sheet 10 and is electrically connected to its corresponding one surface-side electrode 6 to be inspected of the circuit board 5 to be inspected through the first anisotropically conductive elastomer sheet 17. Each of the core electrodes 26 for inspection in the second electrode sheet 20 is also electrically connected to its corresponding junction electrode 14 in the first electrode sheet 10 through the second anisotropically conductive elastomer sheet 18.

Figure 25:
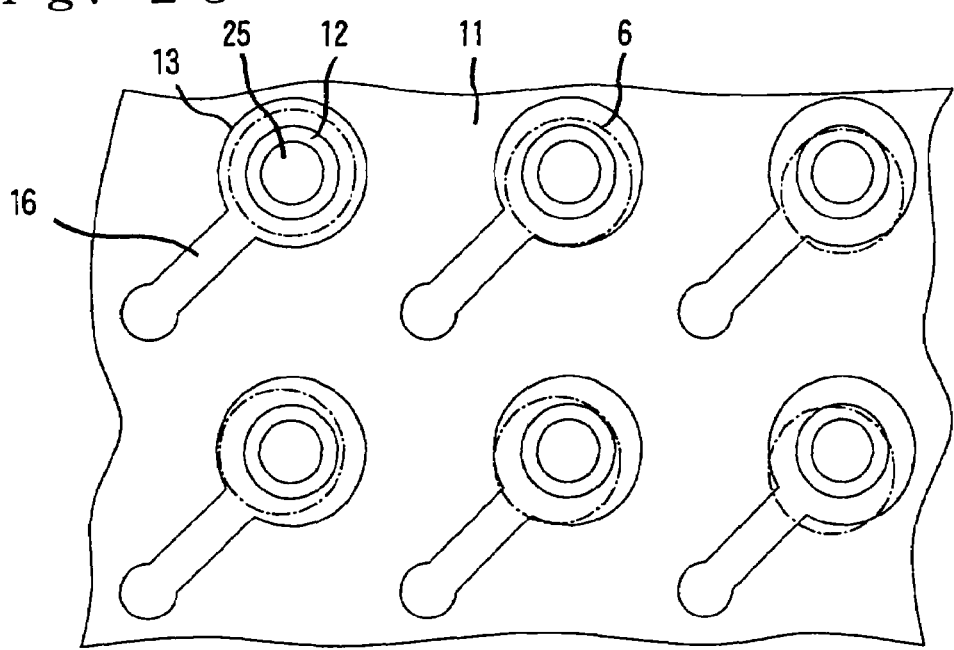
FIG. 25 is a view illustrating a state that positional deviation has occurred between electrodes to be inspected and pairs of connecting electrodes.

At this time, even when the central positions of the core electrodes 25 for inspection, which enter the respective through-holes 12 in the insulating sheet 11, are misregistered from the respective central positions of the one surface-side electrodes 6 to be inspected as illustrated in FIG. 25, the ring-like electrode 13 are always electrically connected to their corresponding one surface-side electrodes 6 to be inspected so far as the core electrodes 25 for inspection are electrically connected to their corresponding one surface-side electrodes 6 to be inspected because the ring-like electrodes 13 in the first electrode sheet 10 are formed so as to surround the respective through-holes 12 in the insulating sheet 11.

In such a state, one of the plurality of one surface-side electrodes 6 to be inspected in the circuit board 5 to be inspected is designated, one of the core electrode 25 for inspection and the ring-like electrode 13, which are electrically connected to this designated one surface-side electrode 6 to be inspected, is used as an electrode for current supply, and the other is used as an electrode for voltage measurement, thereby performing measurement of an electric resistance related to the designated one surface-side electrode 6 to be inspected.

Figure 26:
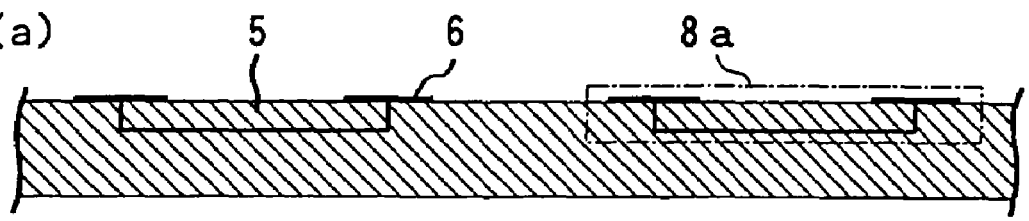
FIG. 26 is a cross-sectional view illustrating the construction of a circuit board to be inspected.
Figure 26:
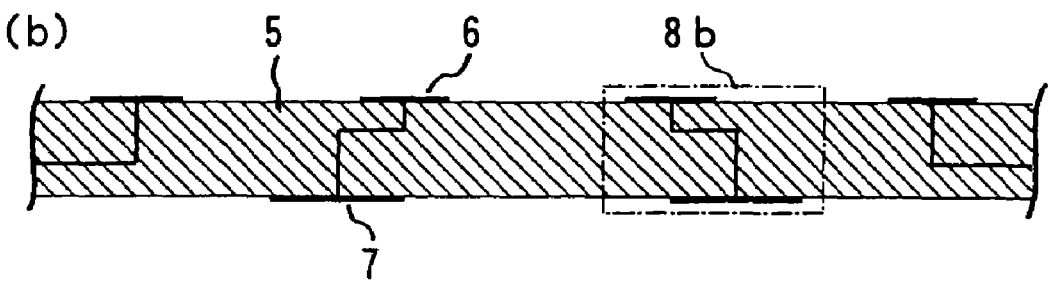
Figure 26:
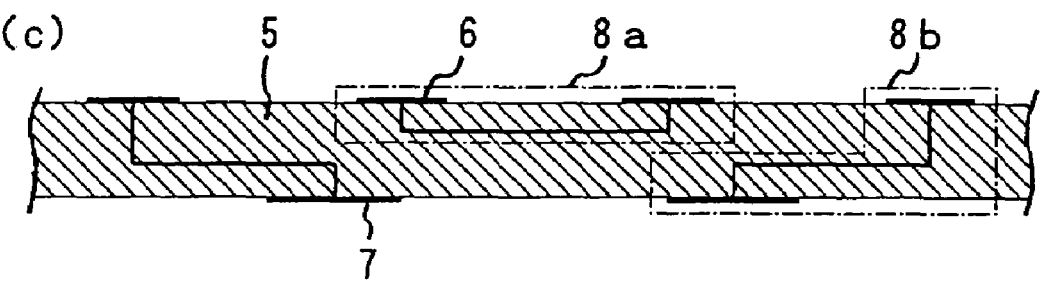

Here, the circuit board 5 to be inspected may be any of a circuit board having only one surface-side electrodes 6 to be inspected formed on its one surface and having only circuits 8a formed between the one surface-side electrodes 6 to be inspected as illustrated in FIG. 26(a), a circuit board having one surface-side electrodes 6 to be inspected formed on its one surface and other surface-side electrodes 7 to be inspected formed on the other surface and having only circuits 8b formed between the one surface-side electrode 6 to be inspected and the other surface-side electrode 7 to be inspected as illustrated in FIG. 26(b), and a circuit board having one surface-side electrodes 6 to be inspected formed on its one surface and other surface-side electrodes 7 to be inspected formed on the other surface and having both circuits 8a formed between the one surface-side electrodes 6 to be inspected and circuits 8b formed between the one surface-side electrode 6 to be inspected and the other surface-side electrode 7 to be inspected as illustrated in FIG. 26(c).

According to the connector 1 for measurement of electric resistance of the above-described construction, the through-holes 12, in which the core electrodes 25 for inspection in the second electrode sheet 20 respectively enter, are formed in the insulating sheet 11 of the first electrode sheet 10, and the ring-like electrodes 13 are formed around the respective through-holes 12 so as to respectively surround the through-holes 12, so that at least a part of the ring-like electrode 13 is located on a one surface-side electrode 6 to be inspected in a circuit board 5 to be inspected so far as alignment is conducted in such a manner that at least a part of the core electrode 25 for inspection is located on the one surface-side electrode 6 to be inspected, whereby electrical connection of both core electrodes 25 for inspection and ring-like electrodes 13 to the one surface-side electrodes 6 to be inspected can be surely achieved even when the circuit board 5 to be inspected is large in area and has a great number of small-sized one surface-side electrodes 6 to be inspected. In addition, since the core electrodes 25 for inspection and the ring-like electrodes 13 are electrically insulated from each other, an electric resistance as to the circuit board 5 to be inspected can be measured with high precision by using one of the core electrode 25 for inspection and the ring-like electrode 13, which are electrically connected to the one surface-side electrode 6 to be inspected, as an electrode for current supply and the other as an electrode for voltage measurement.

Further, since the first electrode sheet 10 and second electrode sheet 20 each have a simple structure, the connector 1 for measurement of electric resistance can be produced at a low cost as a whole. Accordingly, inspection cost can be reduced.

<Electric Resistance-measuring Apparatus for Circuit Board>

Figure 27:
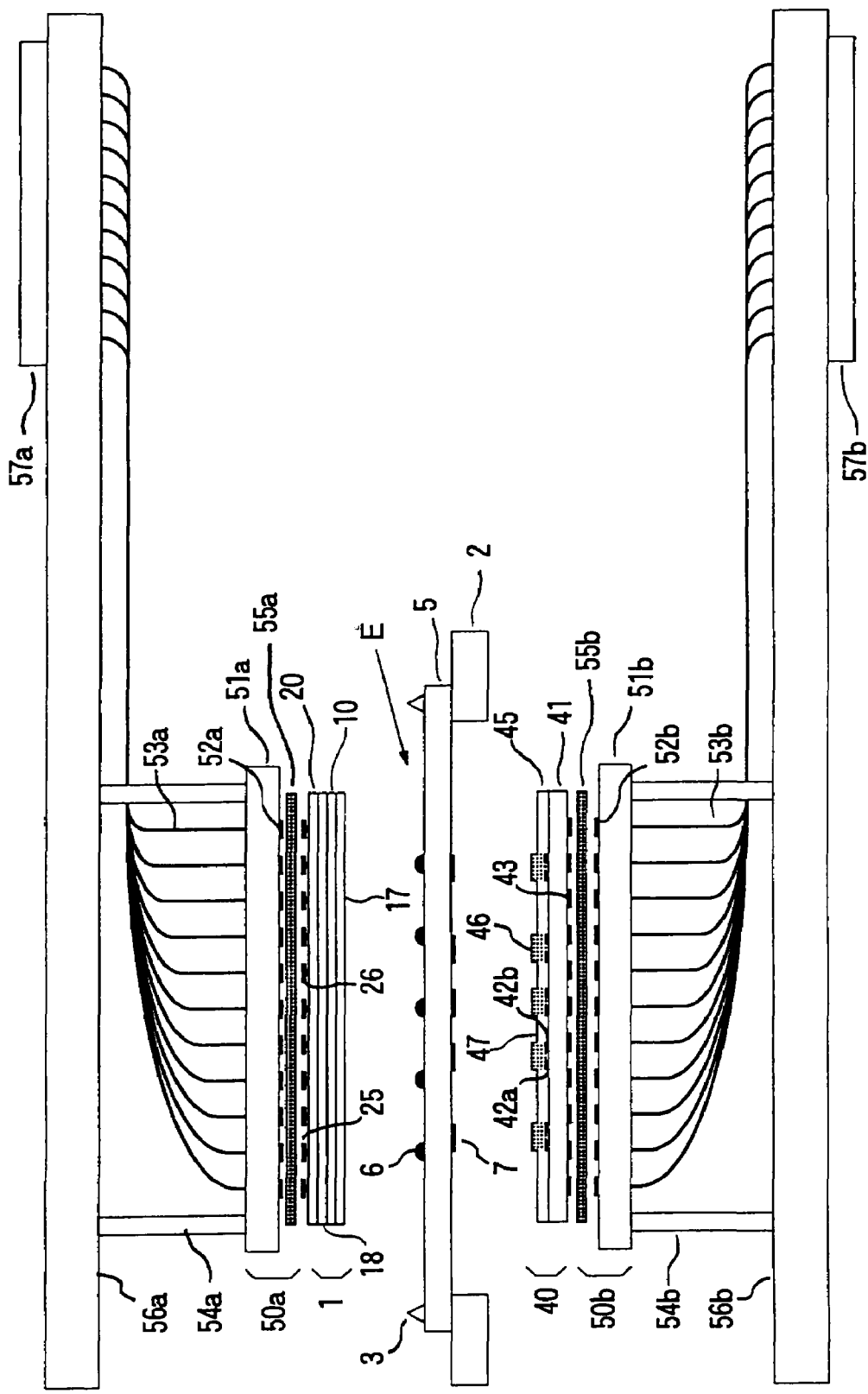
FIG. 27 schematically illustrates the construction of an exemplary electric resistance-measuring apparatus for circuit boards according to the present invention together with a circuit board to be inspected.

FIG. 27 schematically illustrates the construction of an exemplary electric resistance-measuring apparatus for circuit boards according to the present invention. This electric resistance-measuring apparatus serves to conduct an electric resistance-measuring test on each wiring pattern as to a circuit board 5 to be inspected, which has one surface-side electrodes 6 to be inspected on one surface thereof and other surface-side electrodes 7 to be inspected on the other surface, and has a holder 2 for holding the circuit board 5 to be inspected in an inspection-executing region E. This holder 2 is provided with positioning pins 3 for arranging the circuit board 5 to be inspected at a proper position in the inspection-executing region E.

Above the inspection-executing region E, the connector 1 for measurement of electric resistance of the construction shown in FIG. 1 and an upper-side inspection head 50a are arranged in this order from below. Above the upper-side inspection head 50a, an upper-side support plate 56a is further arranged, and the upper-side inspection head 50a is fixed to the upper-side support plate 56a by support posts 54a. On the other hand, below the inspection-executing region E, a connector 40 for measurement of electric resistance and a lower-side inspection head 50b are arranged in this order from above. Below the lower-side inspection head 50b, a lower-side support plate 56b is arranged, and the lower-side inspection head 50b is fixed to the lower-side support plate 56b by support posts 54b.

The connector 40 for measurement of electric resistance is constructed by integrally forming an anisotropically conductive elastomer layer 45 on a circuit board 41 for inspection.

On a front surface (upper surface in FIG. 27) of the circuit board 41 for inspection, pairs of inspection electrodes each composed of an electrode 42a for current supply and an inspection electrode 42b for voltage measurement, which are arranged in a state separated from each other, are formed in accordance with a pattern corresponding to an arrangement pattern of the other surface-side electrodes 7 to be inspected in the circuit board 5 to be inspected. On a back surface of the circuit board 41 for inspection, terminal electrodes 43 are arranged in accordance with a proper pattern. Each of these terminal electrodes 43 is electrically connected to any of the electrode 42a for current supply and the inspection electrode 42b for voltage measurement.

A clearance between the electrode 42a for current supply and the inspection electrode 42b for voltage measurement in the circuit board 41 for inspection is preferably at least 10 μm. If this clearance is shorter than 10 μm, a current flowing between the electrode 42a for current supply and the inspection electrode 42b for voltage measurement through the anisotropically conductive elastomer layer 45 becomes large, so that it may be difficult in some cases to measure an electric resistance with high precision.

On the other hand, the upper limit of this clearance is determined by the size of the respective inspection electrodes and the size and pitch of their corresponding other surface-side electrodes 7 to be inspected, and is generally at most 500 μm. If this clearance is too long, it may be difficult in some cases to suitably arrange both inspection electrodes corresponding to one of the other surface-side electrodes 7 to be inspected.

The anisotropically conductive elastomer layer 45 is constructed by a plurality of conductive path-forming parts 46 arranged in accordance with a pattern corresponding to a pattern of the pairs of inspection electrodes in the circuit board 41 for inspection, and an insulating part 47 mutually insulating these, and each of the conductive path-forming parts 46 is arranged so as to come into contact with the whole surface of both electrode 42a for current supply and inspection electrode 42b for voltage measurement in the pair of inspection electrodes of the circuit board 41 for inspection.

The conductive path-forming parts 46 in the anisotropically conductive elastomer layer 45 are each formed by causing conductive particles exhibiting magnetism to be contained in an elastic polymeric substance in a state oriented so as to align in a thickness-wise direction of the layer. On the other hand, the insulating part 47 does not contain the conductive particles at all or scarcely contains them.

The conductive path-forming part 46 is preferably higher in conductivity in a thickness-wise direction thereof than the conductivity in a plane direction perpendicular to the thickness-wise direction. Specifically, the conductive path-forming part preferably has such electrical property that a ratio of an electric resistance value in the thickness-wise direction to an electric resistance value in the plane direction is 1 or lower, particularly 0.5 of lower. If this ratio exceeds 1, a current flowing between the electrode 42a for current supply and the inspection electrode 42b for voltage measurement through the conductive path-forming part 46 becomes high, so that it may be difficult in some cases to measure an electric resistance with high precision.

As the elastic polymeric substance and conductive particles making up the anisotropically conductive elastomer layer 45, may be used the same as those exemplified as the elastic polymeric substance and conductive particles making up the first anisotropically conductive elastomer sheet 17.

Such an anisotropically conductive elastomer layer 45 can be formed in accordance with any proper process, for example, a process described in Japanese Patent Application Laid-Open No. 2000-74965.

The upper-side inspection head 50a is constructed by a plate-like inspection electrode device 51a and an anisotropically conductive sheet 55a arranged by being fixed to a lower surface of this inspection electrode device 51a and having elasticity. The inspection electrode device 51a has a plurality of electrode pins 52a arranged in accordance with a pattern corresponding to a pattern of the core electrodes 25 for inspection and core electrodes 26 for connection in the connector 1 for measurement of electric resistance. Each of these electrode pins 52a is electrically connected to a connector 57a provided on the upper-side support plate 56a through an electric wire 53a and further electrically connected to an inspection circuit (not illustrated) of a tester through the connector 57a.

The lower-side inspection head 50b is constructed by a plate-like inspection electrode device 51b and an anisotropically conductive sheet 55b arranged by being fixed to an upper surface of this inspection electrode device 51b and having elasticity. The inspection electrode device 51b has a plurality of electrode pins 52b arranged in accordance with a pattern corresponding to a pattern of the terminal electrodes 43 in the connector 40 for measurement of electric resistance. Each of these electrode pins 52b is electrically connected to a connector 57b provided on the lower-side support plate 56b through an electric wire 53b and further electrically connected to the inspection circuit (not illustrated) of the tester through the connector 57b.

The respective anisotropically conductive sheets 55a and 55b in the upper-side inspection head 50a and the lower-side inspection head 50b are such that conductive path-forming parts forming a conductive path only in the thickness-wise direction thereof are formed. As such anisotropically conductive sheets 55a and 55b, are preferred those, in which each conductive path-forming part is formed so as to protrude in the thickness-wise direction on at least one surface in that high electrical contact stability is exhibited.

In such an electric resistance-measuring apparatus for circuit boards, the circuit board 5 to be inspected is held in the inspection-executing region E by the holder 2. In this state, the upper-side support plate 56a and the lower-side support plate 56b are moved in respective directions approaching the circuit board 5 to be inspected, thereby pinching the circuit board 5 to be inspected by the connector 1 for measurement of electric resistance and the connector 40 for measurement of electric resistance.

Figure 28:
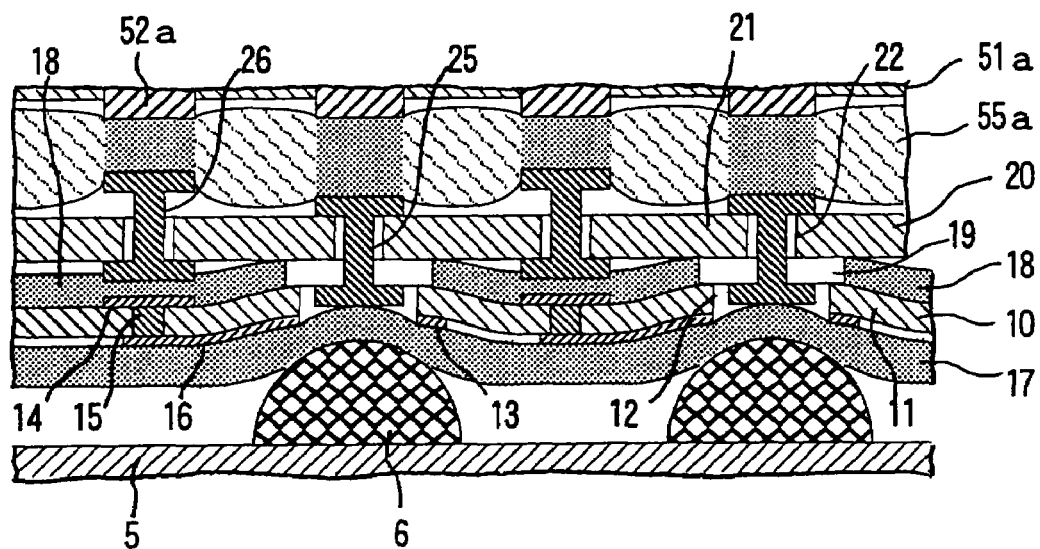
FIG. 28 is a cross-sectional view illustrating a state that one surface-side electrodes to be inspected have been electrically connected to electrode pins of an inspection electrode device in the electric resistance-measuring apparatus for circuit boards shown in FIG. 27.

In this state, as illustrated in FIG. 28, each of the one surface-side electrodes 6 to be inspected of the circuit board 5 to be inspected is electrically connected to both ring-like electrode 13 and core electrode 25 for inspection in the connector 1 for measurement of electric resistance through the first anisotropically conductive elastomer sheet 17, and each of the electrodes 25 for inspection and electrodes 26 for connection in this connector 1 for measurement of electric resistance is electrically connected to the electrode pin 52a of the inspection electrode device 51a through the anisotropically conductive sheet 55a. On the other hand, each of the other surface-side electrodes 7 to be inspected of the circuit board 5 to be inspected is electrically connected to both electrode 42a for current supply and electrode 42b for voltage measurement in the pair of inspection electrodes in the circuit board 41 for inspection of the connector 40 for measurement of electric resistance through the anisotropically conductive elastomer layer 45, and each of the terminal electrodes 43 in this connector 40 for measurement of electric resistance is electrically connected to the electrode pin 52b of the inspection electrode device 51b through the anisotropically conductive sheet 55b.

In such a manner, the electrodes 6 and 7 to be inspected in the circuit board 5 to be inspected are electrically connected to the inspection electrodes 52a of the inspection electrode device 51a in the upper-side inspection head 50a and the inspection electrodes 52b of the inspection electrode device 51b in the lower-side inspection head 50b, respectively, whereby a state electrically connected to the inspection circuit of the tester is achieved. This state is a measurable state. In this measurable state, one among the plurality of one surface-side electrodes 6 to be inspected in the circuit board 5 to be inspected is designated, one of the core electrode 25 for inspection and the ring-like electrode 13, which are electrically connected to this designated one surface-side electrode 6 to be inspected, is used as an electrode for current supply, and the other is used as an electrode for voltage measurement, thereby supplying a current between the core electrode 25 for inspection or the ring-like electrode 13, which is used as the electrode for current supply, and the electrode 42a for current supply in the pair of inspection electrodes, which are electrically connected to an other surface-side electrode 7 to be inspected corresponding to the designated one surface-side electrode 6 to be inspected, and measuring a voltage between the core electrode 25 for inspection or the ring-like electrode 13, which is used as the electrode for voltage measurement, and the electrode 42b for voltage measurement in the pair of inspection electrodes, which are electrically connected to the other surface-side electrode 7 to be inspected corresponding to the designated one surface-side electrode 6 to be inspected. On the basis of the voltage value thus obtained, an electric resistance value of a wiring pattern formed between the designated one surface-side electrode 6 to be inspected and its corresponding other surface-side electrode 7 to be inspected is gained. Electric resistances of all wiring patterns are measured by successively changing the designated one surface-side electrode 6 to be inspected.

According to the above-described electric resistance-measuring apparatus for circuit boards, the connector 1 for measurement of electric resistance of the construction shown in FIG. 1 is provided, so that electrical connection to the one surface-side electrodes 6 to be inspected can be surely achieved even when the circuit board 5 to be inspected is large in area and has a great number of small-sized one surface-side electrodes 6 to be inspected, and so an electric resistance as to the circuit board 5 to be inspected can be measured with high precision.

The present invention is not limited to the above-described embodiments, and various changes or modifications may be added thereto.

For example, the first anisotropically conductive elastomer sheet is not essential in the connector for measurement of electric resistance, and the electric resistance-measuring apparatus may be so constructed that the ring-like electrodes and the core electrodes for inspection come into direct contact with the electrodes to be inspected of the circuit board to be inspected.

Figure 29:
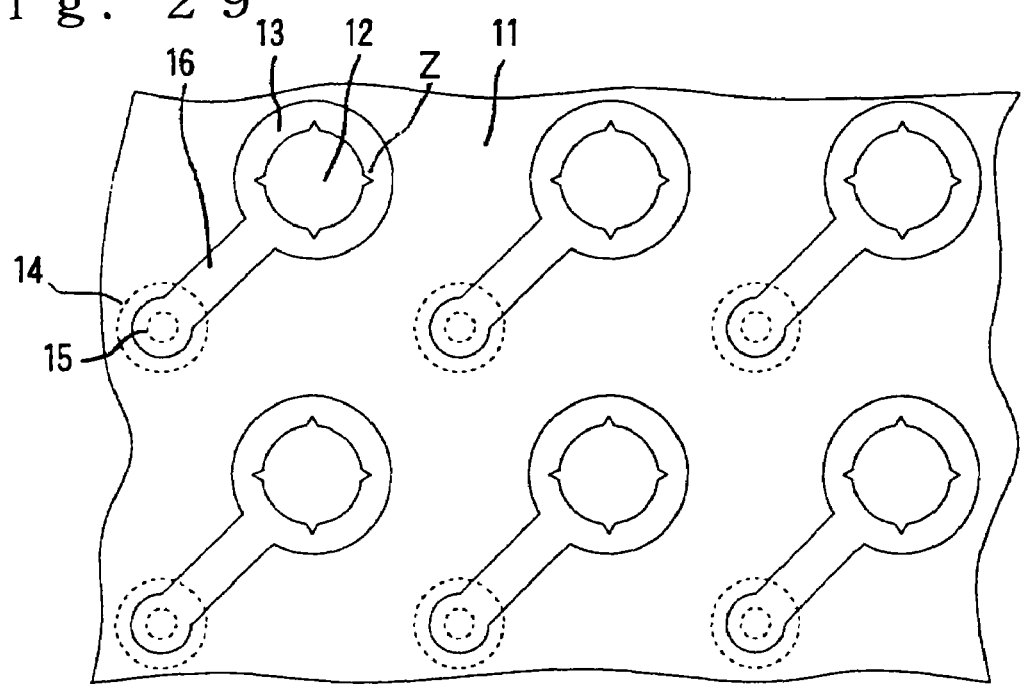
FIG. 29 is a plan view illustrating a modified example of the ring-like electrodes in the first electrode sheet.
Figure 30:
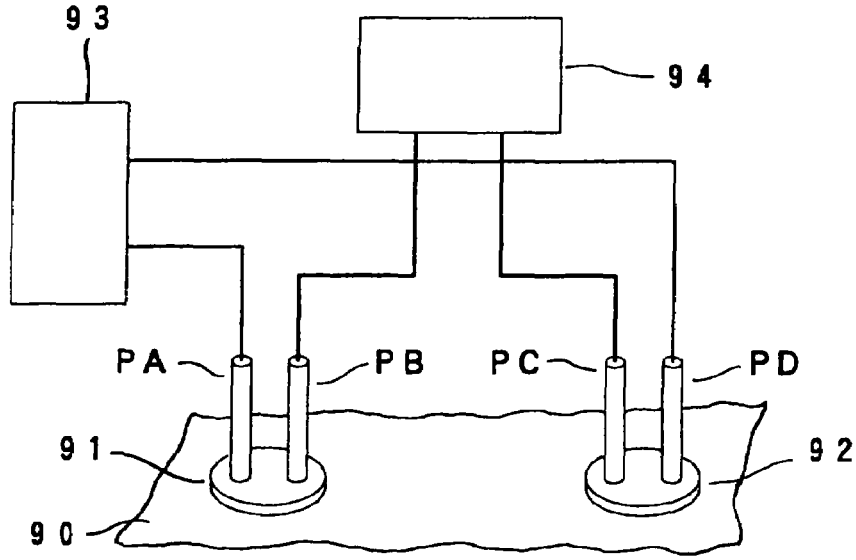
FIG. 30 typically illustrates an apparatus for measuring an electric resistance between electrodes in a circuit board by probes for current supply and probes for voltage measurement.
Figure 31:
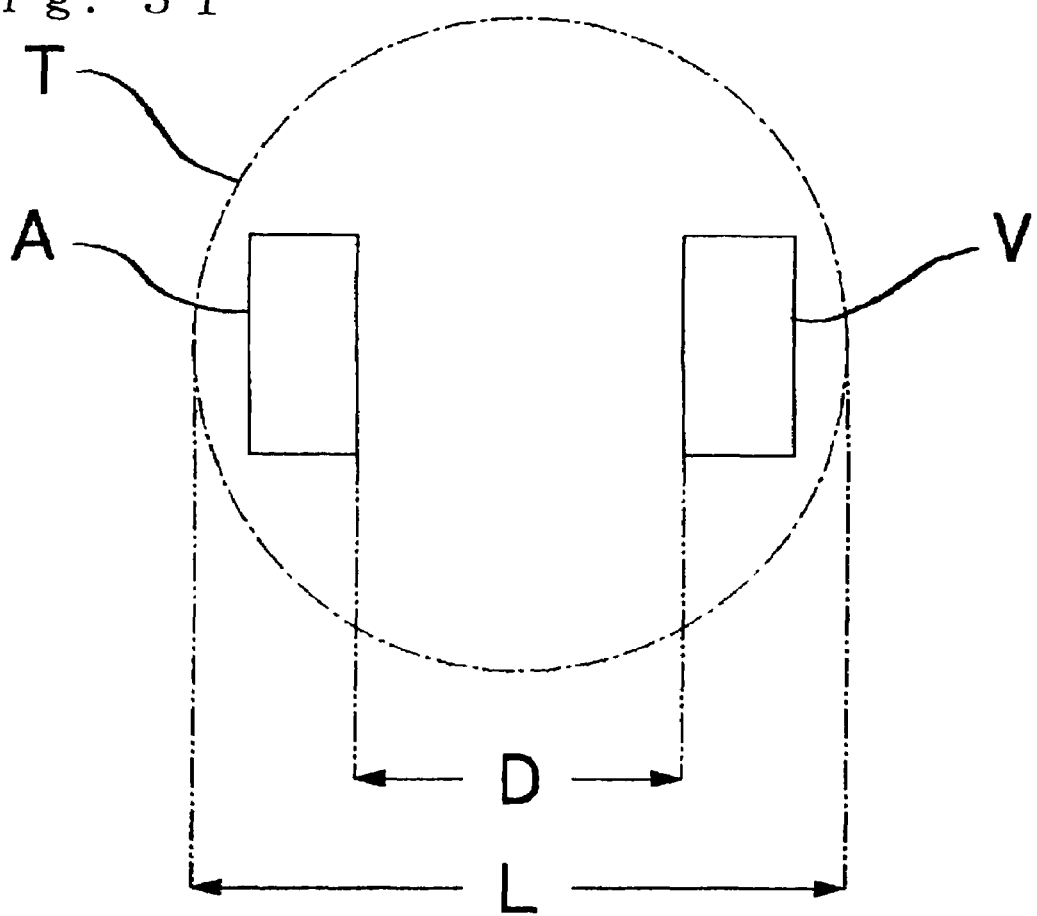
FIG. 31 illustrates a state that an electrode for current supply and an electrode for voltage measurement have been correctly arranged on an electrode to be inspected in a conventional electric resistance-measuring apparatus for circuit boards.
Figure 32:
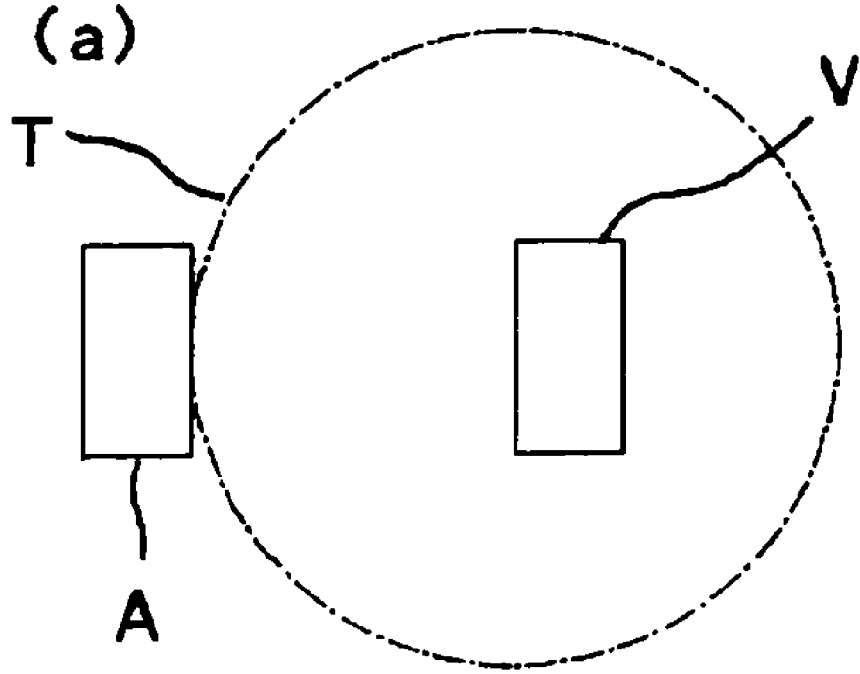
FIG. 32 illustrates a state that the electrode for current supply and the electrode for voltage measurement have been arranged in a state misregistered on the electrode to be inspected in the conventional electric resistance-measuring apparatus for circuit boards.
Figure 32:
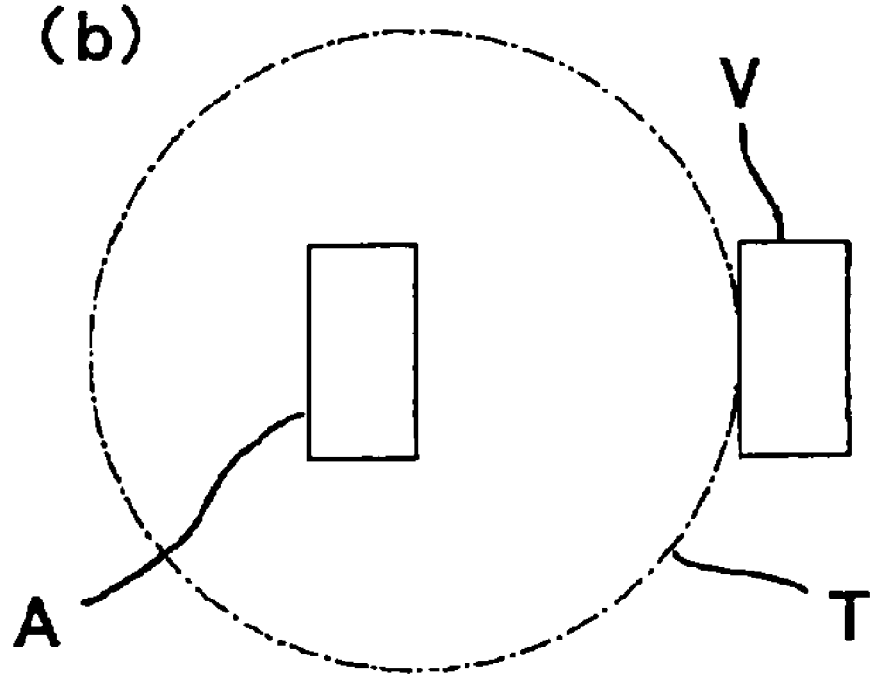

With respect to the ring-like electrode 13 in the first electrode sheet 10, notches Z may be formed at an inner edge thereof as illustrated in FIG. 29. According to such construction, the flexibility of the ring-like electrode 13 is improved, which achieves an effect that when the electrodes to be inspected are projected electrodes such as solder balls, contacting ability between such electrodes to be inspected and the ring-like electrodes 13 is improved.

EXAMPLES

<Production of Circuit Device for Evaluation>

A circuit board for evaluation of the following specification was produced.

More specifically, this circuit board for evaluation has dimensions of 30 mm (length)×30 mm (breadth)×0.8 mm (thickness), and upper surface-side electrodes to be inspected are each composed of a solder bump. The total number of the upper surface-side electrodes to be inspected is 900, and each electrode has a diameter of about 100 μm and a projected height of about 80 μm. A minimum pitch between the electrodes is 225 μm. Lower surface-side electrodes to be inspected are in the form of a circular plate, the total number thereof is 900, and the lower surface-side electrodes to be inspected each have a diameter of about 500 μm and are arranged at a minimum pitch of 800 μm. The upper surface-side electrodes to be inspected and the lower surface-side electrodes to be inspected are electrically connected to each other in relation of one to one through respective internal wirings.

Example 1

A connector for measurement of electric resistance for measuring an electric resistance of the above-described circuit board for evaluation was produced in the following manner.

[Upper-side Connector for Measurement of Electric Resistance]

(1) Production of First Electrode Sheet:

A laminate material ("Espanex LC09-25-00NE", product of Nippon Steel Chemical Co., Ltd.) with a metal layer composed of copper and having a thickness of 9 μm integrally laminated on a front surface of an insulating sheet composed of a liquid crystal polymer and having a thickness of 25 μm was provided, and a dry film resist was laminated on the metal layer in this laminate material, thereby forming a resist film.

The thus-formed resist film was then subjected to an exposure treatment and a development treatment, whereby circular pattern holes having a diameter of 50 μm were formed in the resist film in accordance with a pattern of short circuit parts to be formed, an etching treatment was further conducted, whereby openings of the same pattern as the pattern holes in the resist film were formed in the metal layer, and the resist film was then removed.

Thereafter, the insulating sheet in the laminate material was subjected to laser beam machining through the openings formed in the metal layer by means of a $CO_2$ laser beam machine, thereby forming through-holes respectively linked to the openings in the metal layer.

A dry film resist having a thickness of 15 μm was then laminated on a back surface of the insulating sheet in the laminate material, and an exposure treatment and a development treatment were conducted, thereby forming a resist film, in which circular pattern holes having a diameter of 60 μm were formed at positions corresponding to the through-holes in the insulating sheet. A protecting film was further arranged on the metal layer in this laminate material.

The laminate material was then subjected to an electroplating treatment with a plating solution with nickel sulfamate dissolved therein using the metal layer as a common electrode, thereby filling a metal into the openings in the metal layer, the through-holes in the insulating sheet and the pattern holes in the resist film, thereby forming junction electrodes on the back surface of the insulating sheet and short circuit parts each electrically connecting the junction electrode to the metal layer. Thereafter, the surface of the resist film was subjected to a polishing treatment to smoothen the surface, and the protecting film arranged on the metal layer and the resist film formed on the front surface of the insulating sheet were then removed.

A resist film was then formed on the metal layer and subjected to an exposure treatment and a development treatment, thereby forming a resist pattern of a pattern corresponding to a pattern of ring-like electrodes and wiring parts to be formed. The metal layer was further subjected to an etching treatment, thereby forming circular ring-like electrodes and wiring parts on the front surface of the insulating sheet. The resist pattern was then removed.

The insulating sheet was then subjected to ultraviolet laser beam machining using the ring-like electrodes as masks, thereby forming through-holes in the insulating sheet, thus producing the first electrode sheet.

The thus-obtained first electrode sheet will be described and is as follows.

With respect to the insulating sheet, the material thereof is a liquid crystal polymer, and the dimensions thereof are 30 mm in length, 30 mm in breadth and 25 μm in thickness. The diameter of the through-holes is 80 μm, and the pitch between the through-holes is 225 μm.

With respect to the ring-like electrodes, the material thereof is copper, the outer diameter is 80 μm, the thickness is 9 μm, and the pitch between them is 225 μm.

With respect to the junction electrodes, the material thereof is nickel, the diameter is 60 μm, the thickness is about 15 μm, and the pitch between them is 225 μm.

With respect to the junction electrodes, the material thereof is nickel, and the diameter is 50 μm.

With respect to the short circuit parts, the material thereof is copper, the thickness is 9 μm, and each short circuit part is formed of a circular land linked to the short circuit part and having an outer diameter of 96 μm and a line having a line width of 60 μm.

A center distance between the through-hole in the insulating sheet and the junction electrode adjoining it is 160 μm.

(2) Production of Second Electrode Sheet:

A laminate material ("Espanex LC18-25-00NE", product of Nippon Steel Chemical Co., Ltd.) with a metal layer composed of copper and having a thickness of 18 μm integrally laminated on one surface of an insulating support sheet composed of a liquid crystal polymer and having a thickness of 25 μm was provided, and a dry film resist was laminated on the metal layer in this laminate material, thereby forming a resist film.

The thus-formed resist film was then subjected to an exposure treatment and a development treatment, whereby circular pattern holes having a diameter of 40 μm were formed in the resist film in accordance with a pattern corresponding to a pattern of the through-holes and junction electrodes in the first electrode sheet, the metal layer is further subjected to an etching treatment, whereby openings of the same pattern as the pattern holes in the resist film were formed in the metal layer, and the resist film was then removed.

The insulating support sheet in the laminate material was subjected to laser beam machining through the openings formed in the metal layer by means of a $CO_2$ laser beam machine, thereby forming through-holes respectively linked to the openings in the metal layer.

The inner wall surfaces of the through-holes in the insulating support sheet were subjected to an electroless plating treatment with copper, and additionally to an electroplating treatment with copper using the metal layer as a common electrode, whereby cylindrical thin metal layers composed of copper and having a thickness of 5 μm were formed so as to cover the inner wall surfaces of the through-holes in the insulating support sheet and the opening edges of the metal layer, thus producing a composite laminate material. In this process, the diameter of the through-holes after the thin metal layers were formed was about 30 μm.

Dry film resists having a thickness of 15 μm were then laminated on both surfaces (the surface of the metal layer formed on one surface of the insulating support sheet and the other surface of the insulating support sheet) of the composite laminate material, and an exposure treatment and a development treatment were conducted, thereby forming resist films, in which circular pattern holes having a diameter of 50 μm were formed in accordance with a pattern corresponding to a pattern of terminal parts in rigid conductors to be formed. Thereafter, a plating solution with nickel sulfamate dissolved therein was used to conduct an electroplating treatment using the metal layer as a common electrode, thereby forming core electrodes for inspection and core electrodes for connection each composed of nickel.

The surfaces of the respective terminal parts of the core electrodes for inspection and the core electrodes for connection were polished, whereby the surfaces of the terminal parts were smoothened, and at the same time the thickness of each terminal part was caused to conform to the thickness of the resist film. After the resist films were then removed from both surfaces of the composite laminate material, the composite laminate material was subjected to an etching treatment at 60° C. for 3 hours using an etchant with ferric chloride dissolved therein, thereby removing the metal layer and the thin metal layers, thus producing a composite conductive sheet.

The thus-obtained composite conductive sheet will be described. With respect to the insulating support sheet, the material thereof is a liquid crystal polymer, and the dimensions thereof are 30 mm in length, 30 mm in breadth and 25 μm in thickness d. The diameter of the through-holes is 40 μm. With respect to the core electrodes for inspection and core electrodes for connection, the total number thereof is 2,400, the diameter of each body part is 30 μm, the diameter of each terminal part is 50 μm, the length of the body part is 48 μm, and the movable distance is 23 μm.

(3) Production of First Anisotropically Conductive Elastomer Sheet:

After 400 parts by weight of conductive particles having a number average particle diameter of 8 μm were added and mixed into 100 parts by weight of addition type liquid silicone rubber, the resultant mixture was subjected to a defoaming treatment by pressure reduction, thereby preparing a material for conductive elastomer.

In the above-described process, those (average coating amount: 2% by weight of the weight of core particles) obtained by using nickel particles as core particles and subjecting the core particles to electroless plating with gold were used as the conductive particles.

After a frame-like spacer having a thickness of 20 μm and a rectangular opening of 90 mm×90 mm in dimensions was arranged on a molding surface of an other surface-side molding member, the material for conductive elastomer prepared above was applied into the opening of the spacer, and a one surface-side molding member was arranged on the material for conductive elastomer in such a manner that the molding surface thereof comes into contact with the material for conductive elastomer.

In the above-described process, polyester resin sheets having a thickness of 0.1 mm were used as the one surface-side molding member and the other surface-side molding member.

Thereafter, a press roll device composed of a press roll and a support roll was used to pinch the material for conductive elastomer by the one surface-side molding member and the other surface-side molding member, thereby forming a layer of the material for conductive elastomer having a thickness of 20 μm between the one surface-side molding member and the other surface-side molding member.

The layer of the material for conductive elastomer was then subjected to a curing treatment under conditions of 120° C. for 30 minutes while applying a magnetic field of 0.3 T to the layer of the material for conductive elastomer in a thickness-wise direction thereof by arranging electromagnets on the respective back surfaces of the one surface-side molding member and the other surface-side molding member, thereby producing a rectangular anisotropically conductive elastomer sheet having a thickness of 20 μm.

The thus-obtained anisotropically conductive elastomer sheet was cut into a piece having dimensions of 30 mm in length and 30 mm in breadth, and the cut piece was used as the first anisotropically conductive elastomer sheet.

(4) Production of Second Anisotropically Conductive Elastomer Sheet:

An anisotropically conductive elastomer sheet was produced in the same manner as in the production of the first anisotropically conductive elastomer sheet in the above item (3) except that the thickness of the frame-like spacer was changed from 20 μm to 30 μm.

The thus-obtained anisotropically conductive elastomer sheet was subjected to ultraviolet laser beam machining, whereby through-holes having a diameter of 100 μm were formed in accordance with a pattern corresponding to the upper surface-side electrodes to be inspected in the circuit board for evaluation. Thereafter, the thus-machined anisotropically conductive elastomer sheet was cut into a piece having dimensions of 30 mm in length and 30 mm in breadth, thereby producing a second anisotropically conductive elastomer sheet.

(5) Production of Connector for Measurement of Electric Resistance:

The first anisotropically conductive elastomer sheet was arranged on a front surface of the first electrode sheet, the second anisotropically conductive elastomer sheet was arranged in alignment on a back surface of the first electrode sheet in such a manner that the positions of the through-holes thereof conform to the positions of the through-holes in the first electrode sheet, the second electrode sheet was arranged in alignment on a back surface of the second anisotropically conductive elastomer sheet in such a manner that the positions of the core electrodes for inspection thereof conform to the positions of the through-holes in the second anisotropically conductive elastomer sheet, and these components were fixed to one another, thereby producing a connector for measurement of electric resistance.

[Lower-side Connector for Measurement of Electric Resistance]

A connector for measurement of electric resistance of the following specification with an anisotropically conductive elastomer layer integrally laminated on a circuit board for inspection was produced in accordance with the construction shown in FIG. 27.

In the circuit board for inspection, pairs of inspection electrodes each composed of an inspection electrode for current supply in the form of a rectangle having dimensions of 0.15 mm in length and 0.5 mm in breadth and an inspection electrode for voltage measurement in the form of a rectangle having dimensions of 0.15 mm in length and 0.5 mm in breadth are formed on a front surface thereof in accordance with a pattern corresponding to a pattern of the lower surface-side electrodes to be inspected in the circuit board for evaluation, and a clearance between the inspection electrode for current supply and the inspection electrode for voltage measurement in each pair of inspection electrodes is 0.2 mm. On a back surface of the circuit board for inspection, circular terminal electrodes each having a diameter of 0.4 mm are arranged at a pitch of 0.75 mm.

Conductive path-forming parts in the anisotropically conductive elastomer layer are such that conductive particles composed of nickel particles (average particle diameter: 30 μm) plated with gold on the surfaces thereof are contained in silicone rubber in a proportion of 25% by volume, and each have dimensions of 0.6 mm in diameter and 0.1 mm in thickness. The insulating part in the anisotropically conductive elastomer layer is composed of silicone rubber and has a thickness of 0.8 mm.

[Production of Inspection Apparatus]

The above-described connector for measurement of electric resistance was used to produce an inspection apparatus adapted to an inspection section of a rail-conveying type automatic circuit board inspection machine (manufactured by NIDEC-READ CORPORATION, trade name: STARREC V5) according to the construction shown in FIG. 27.

In the upper-side inspection head of this inspection apparatus, 900 electrode pins are arranged in its inspection electrode device according to positions of lattice points at a pitch of 160 μm.

The anisotropically conductive elastomer sheet in the upper-side inspection head is an uneven distribution type anisotropically conductive elastomer sheet, in which conductive path-forming parts each extending in a thickness-wise direction of the sheet are mutually insulated by an insulating part. More specifically, each of the conductive path-forming parts is such that nickel particles (average particle diameter: 12 μm) subjected to a plating treatment with gold are contained in silicone rubber in a proportion of 25% in terms of a volume fraction, and the conductive path-forming parts are arranged according to positions of lattice points at a pitch of 160 μm. Each of the conductive path-forming parts is formed so as to protrude from both surfaces of the insulating part and has a diameter of 0.1 mm and a thickness of 0.12 mm. The projected heights from both surfaces of the insulating part are each 0.01 mm. On the other hand, the insulating part is formed of silicone rubber and has a thickness of 0.1 mm.

On the other hand, in the lower-side inspection head, 900 electrode pins are arranged in its inspection electrode device according to positions of lattice points at a pitch of 750 μm.

The anisotropically conductive elastomer sheet in the lower-side inspection head is an uneven distribution type anisotropically conductive elastomer sheet, in which conductive path-forming parts each extending in a thickness-wise direction of the sheet are mutually insulated by an insulating part. More specifically, each of the conductive path-forming parts is such that nickel particles (average particle diameter: 35 μm) subjected to a plating treatment with gold are contained in silicone rubber in a proportion of 25% in terms of a volume fraction, and the conductive path-forming parts are arranged according to positions of lattice points at a pitch of 0.75 mm. Each of the conductive path-forming parts is formed so as to protrude from both surfaces of the insulating part and has a diameter of 0.4 mm and a thickness of 0.55 mm. The projected heights from both surfaces of the insulating part are each 0.05 mm. On the other hand, the insulating part is constructed by forming elastic layers composed of silicone rubber on both surfaces of a reinforcing plate composed of a BT resin. The thickness of the reinforcing plate is 0.1 mm, the thickness of each of the two elastic layers is 0.175 mm, and the overall thickness of the insulating part is 0.45 mm.

[Evaluation]

(1) Connection Stability Test:

The above-described inspection apparatus was installed in the inspection section of the rail-conveying type automatic circuit board inspection machine "STARREC V5", and the circuit board for evaluation was arranged in alignment in the inspection region of the inspection apparatus. A pressurizing operation was then conducted against the circuit board for evaluation under a prescribed press load. In this state, a current of 1 mA was applied between a ring-like electrode in the upper-side connector for measurement of electric resistance and an electrode for current supply in the lower-side connector for measurement of electric resistance to measure a voltage between a core electrode for inspection in the upper-side connector for measurement of electric resistance and an electrode for voltage measurement in the lower-side connector for measurement of electric resistance, thereby determining an electric resistance value as to the circuit board for evaluation. The number of inspection points (hereinafter referred to as "NG inspection point") at which the electric resistance value measured reached 10Ω or higher was counted. After this operation for counting the number of NG inspection points was conducted ten times in total, a proportion (hereinafter referred to as "proportion of NG inspection points") of the number of the NG inspection points to the total number (900× 10=9,000) of inspection points was calculated out. The process of determining such a proportion of NG inspection points was conducted by changing the press load stepwise within a range of 100 to 210 kgf, thereby determining a minimum press load (hereinafter referred to as "connectable load") under which the proportion of NG inspection points was 0.01% or lower. In actual inspection of circuit boards, it is necessary that the proportion of NG inspection points is 0.01% or lower. If the proportion of NG inspection points exceeds 0.01%, there is a possibility that a non-defective circuit board to be inspected may be judged to be a defective. It is hence difficult to conduct electrical inspection as to circuit boards with high reliability.

In the process of determining the proportion of NG inspection points, the pressurization against the circuit board for evaluation was released to bring a non-pressurized state after each operation for counting the number of NG inspection points is completed. Thereafter, next operation for counting the number of NG inspection points was conducted. The results are shown in the following Table 1.

In the above-described test, the smaller connectable load value indicates that the irregularity-absorbing ability in the connector for measurement of electric resistance is higher. Since stable electrical connection to the circuit board is achieved under a small load by using the connector for measurement of electric resistance having high irregularity-absorbing ability, deterioration of the connector for measurement of electric resistance, other constructional members of the inspection apparatus, and the circuit board to be inspected by pressurization is inhibited. As a result, the service life of the respective constructional members in the inspection apparatus can be lengthened, and members relatively low in durable may be used as the constructional members of the inspection apparatus, so that production cost of the whole inspection apparatus can be reduced.

[Insulating Property Test]

The above-described inspection apparatus was installed in the inspection section of the rail-conveying type automatic circuit board inspection machine "STARREC V5", and a board having dimensions of 100 mm in both length and breadth and a thickness of 0.8 mm and composed of a glass fiber-reinforced epoxy resin subjected to an insulating coating treatment on the surface thereof was arranged in the inspection region of the inspection apparatus. A pressurizing operation was then conducted against the board under a prescribed press load to measure a voltage value between a ring-like electrode and a core electrode for inspection in the upper-side connector for measurement of electric resistance. The number of pairs of electrodes (hereinafter referred to as "good-insulation pairs of electrodes") between which the electric resistance value measured reached 10 kΩ or higher was counted. After this operation for counting the number of good-insulation pairs of electrodes was conducted 10 times in total, a proportion (hereinafter referred to as "proportion of good-insulation pairs of electrodes") of the number of the good-insulation pairs of electrodes to the total number (900× 10=9,000) of pairs of electrodes was calculated out. In actual inspection of circuit boards, it is necessary that the proportion of good-insulation pairs of electrodes is 99% or higher. If the proportion of good-insulation pairs of electrodes is lower than 99%, there is a possibility that a current supplied to the ring-like electrode may leak into the core electrode for inspection to judge a defective circuit board to be inspected to be non-defective. It is hence difficult to conduct electrical inspection as to circuit boards with high reliability. The process of determining the proportion of good-insulation pairs of electrodes was conducted by changing the press load stepwise within a range of 100 to 210 kgf. The results are shown in Table 2.

Comparative Example 1

An inspection apparatus was constructed in the same manner as in Example 1 except that the following connector was used as the upper-side connector for measurement of electric resistance, and its evaluation was made.

This connector for measurement of electric resistance is constructed by a circuit board for inspection and an anisotropically conductive elastomer sheet arranged on a front surface of this circuit board for inspection.

The circuit board for inspection is formed of a glass fiber-reinforced epoxy resin and has dimensions of 30 mm in length and 30 mm in breadth. On a front surface thereof, pairs of inspection electrodes each composed of an inspection electrode for current supply in the form of a rectangle having dimensions of 120 µm in length and 60 µm in breadth and an inspection electrode for voltage measurement in the form of a rectangle having dimensions of 120 µm in length and 60 µm in breadth are formed in accordance with a pattern corresponding to the pattern of the lower surface-side electrodes to be inspected in the circuit board for evaluation, and a clearance between the inspection electrode for current supply and the inspection electrode for voltage measurement in each pair of inspection electrodes is 30 µm. On a back surface of the circuit board for inspection, 900 circular terminal electrodes each having a diameter of 0.4 mm are arranged at a pitch of 0.75 mm.

On the other hand, the anisotropically conductive elastomer sheet has the same construction (thickness: 20 µm) as the first anisotropically conductive elastomer sheet in the connector for measurement of electric resistance used in Example 1.

The results are shown in Table 1 and Table 2.

Comparative Example 2

An inspection apparatus was constructed in the same manner as in Comparative Example 1 except that a sheet having a thickness of 50 µm was used as the anisotropically conductive elastomer sheet in the upper-side connector for measurement of electric resistance, and its evaluation was made.

The results are shown in Table 1 and Table 2.

Comparative Example 3

An inspection apparatus was constructed in the same manner as in Comparative Example 1 except that the following sheet was used as the anisotropically conductive elastomer sheet in the upper-side connector for measurement of electric resistance, and its evaluation was made.

This anisotropically conductive elastomer sheet is the so-called uneven distribution type anisotropically conductive elastomer sheet, in which conductive path-forming parts each having dimensions of 120 µm in length, 60 µm in breadth and 120 µm in thickness are arranged in accordance with a pattern corresponding to a pattern of the inspection electrodes for current supply and the inspection electrodes for voltage measurement in the circuit board for inspection. These conductive path-forming parts are insulated from each other by an insulating part having a thickness of 80 µm. Each of the conductive path-forming parts is formed in a state protruding from both surfaces of the insulating part, and the projected heights thereof are each 20 µm.

The conductive path-forming parts are such that conductive particles are contained in silicone rubber in a proportion of 30% by volume. On the other hand, the insulating part is formed by silicone rubber. The silicone rubber making up the conductive path-forming parts and insulating part, and the conductive particles making up the conductive path-forming parts are the same as those of the first anisotropically conductive elastomer sheet in the connector for measurement of electric resistance used in Example 1.

The results are shown in Table 1 and Table 2.

TABLE 1

| | Proportion of NG inspection points (%) Press load (kgf) | | | | | | Connectable |
| --- | --- | --- | --- | --- | --- | --- | --- |
| | 100 | 110 | 130 | 150 | 180 | 210 | load (kgf) |
| Example 1 | 0.2 | 0 | 0 | 0 | 0 | 0 | 110 |
| Comparative Example 1 | 20≦ | 20≦ | 20≦ | 18 | 18 | 16 | Impossible |
| Comparative Example 2 | 7.6 | 3.3 | 0 | 0 | 0 | 0 | 130 |
| Comparative Example 3 | 0 | 0 | 0 | 0 | 0 | 0 | 100 |

TABLE 2

| | Proportion of good-insulation pairs of electrodes (%) Press load (kgf) | | | | | |
| --- | --- | --- | --- | --- | --- | --- |
| | 100 | 110 | 130 | 150 | 180 | 210 |
| Example 1 | 100 | 100 | 100 | 100 | 100 | 100 |
| Comparative Example 1 | 100 | 100 | 100 | 100 | 100 | 100 |
| Comparative Example 2 | 100 | 100 | 100 | 99.8 | 99.5 | 99.2 |
| Comparative Example 3 | 80≧ | 80 | 80≧ | 80≧ | 80≧ | 80≧ |

As apparent from the results shown in Table 1 and Table 2, it was confirmed that according to the inspection apparatus of Example 1, necessary electrical connection to the circuit board for evaluation can be surely achieved, and moreover expected measurement of electric resistance can be surely performed with high precision.

The invention claimed is:

1. A connector for measurement of electric resistance, comprising a first electrode sheet, an anisotropically conductive elastomer sheet arranged on a back surface of the first electrode sheet and a second electrode sheet arranged on a back surface of the anisotropically conductive elastomer sheet, wherein the first electrode sheet has a flexible insulating sheet having a plurality of through-holes formed in accordance with a pattern corresponding to a pattern of electrodes to be inspected in a circuit board, the electric resistance of which is to be measured, a plurality of ring-like electrodes each formed on a front surface of the insulating sheet so as to surround the through-hole in the insulating sheet, and junction electrodes each formed on a back surface of the insulating sheet and electrically connected to the ring-like electrode, wherein the anisotropically conductive elastomer sheet has a plurality of through-holes formed in accordance with the pattern corresponding to the pattern of the electrodes to be inspected, wherein the second electrode sheet has a first plurality of core electrodes for inspection arranged in accordance with the pattern corresponding to the pattern of the electrodes to be inspected, a second plurality of core electrodes for connection arranged in accordance with a pattern corresponding to a pattern of the junction electrodes in the first electrode sheet, and an insulating support sheet supporting the core electrodes for inspection and the core electrodes for connection, and wherein the core electrodes for inspection each enter the through-hole in the anisotropically conductive elastomer sheet and the through-hole in the insulating sheet of the first electrode sheet to be electrically connected to an electrode to be inspected.

2. The connector for measurement of electric resistance according to claim 1, wherein the core electrodes for inspection and the core electrodes for connection in the second electrode sheet are provided movably in a thickness-wise direction of the insulating support sheet.

3. An electric resistance-measuring apparatus for circuit boards, comprising the connector for measurement of electric resistance according to claim 1 or 2, which is arranged on one surface side of a circuit board to be inspected, the electric resistance of which is to be measured, wherein the ring-like electrode of the first electrode sheet and one of the core electrodes for inspection of the second electrode sheet in the connector for measurement of electric resistance are electrically connected at the same time to each of one surface-side electrodes to be inspected in the circuit board to be inspected, thereby creating a measurable state, and wherein in this measurable state, one of the core electrodes for inspection and the ring-like electrode electrically connected to one designated one surface-side electrode to be inspected is used as an electrode for current supply, and the other one of the core electrodes for inspection and the ring-like electrode electrically connected to the one designated one surface-side electrode to be inspected is used as an electrode for voltage measurement, thereby performing measurement of electric resistance related to the designated one surface-side electrode.

4. The electric resistance-measuring apparatus for circuit boards according to claim 3, which comprises another surface-side circuit board for inspection arranged on the other surface side of the circuit board to be inspected, wherein the other surface-side circuit board for inspection has, on its front surface, an electrode for current supply and an electrode for voltage measurement, which are arranged corresponding to each of other surface-side electrodes to be inspected of the circuit board to be inspected, formed in a state separated from each other and electrically connected to the same other surface-side electrode to be inspected.

5. An electric resistance-measuring method for circuit boards, which comprises arranging the connector for measurement of electric resistance according to claim 1 or 2 on one surface of a circuit board to be inspected, the electric resistance of which is to be measured, electrically connecting the ring-like electrode of the first electrode sheet and one of the core electrodes for inspection of the second electrode sheet in the connector for measurement of electric resistance at the same time to each of one surface-side electrodes to be inspected in the circuit board to be inspected, thereby creating a measurable state, and using, in this measurable state, one of the core electrodes for inspection and the ring-like electrode electrically connected to one designated one surface-side electrode to be inspected as an electrode for current supply and the other one of the core electrodes for inspection and the ring-like electrode electrically connected to the one designated one surface-side electrode to be inspected as an electrode for voltage measurement, thereby performing measurement of electric resistance related to the designated one surface-side electrode.

6. A connector for measurement of electric resistance, comprising a first electrode sheet, a first anisotropically conductive elastomer sheet arranged on a front surface of the first electrode sheet, a second anisotropically conductive elastomer sheet arranged on a back surface of the first electrode sheet and a second electrode sheet arranged on a back surface of the second anisotropically conductive elastomer sheet, wherein the first electrode sheet has a flexible insulating sheet having a plurality of through-holes formed in accordance with a pattern corresponding to a pattern of electrodes to be inspected in a circuit board, the electric resistance of which is to be measured, a plurality of ring-like electrodes each formed on a front surface of the insulating sheet so as to surround the through-hole in the insulating sheet, and junction electrodes each formed on a back surface of the insulating sheet and electrically connected to the ring-like electrode, wherein the second anisotropically conductive elastomer sheet has a plurality of through-holes formed in accordance with the pattern corresponding to the pattern of the electrodes to be inspected, wherein the second electrode sheet has a first plurality of core electrodes for inspection arranged in accordance with the pattern corresponding to the pattern of the electrodes to be inspected, a second plurality of core electrodes for connection arranged in accordance with a pattern corresponding to a pattern of the junction electrodes in the first electrode sheet, and an insulating support sheet supporting the core electrodes for inspection and the core electrodes for connection, and wherein the core electrodes for inspection each enter the through-hole in the second anisotropically conductive elastomer sheet and the through-hole in the insulating sheet of the first electrode sheet to be electrically connected to an electrode to be inspected through the first anisotropically conductive elastomer sheet.

7. The connector for measurement of electric resistance according to claim 6, wherein the core electrodes for inspection and the core electrodes for connection in the second electrode sheet are provided movably in a thickness-wise direction of the insulating support sheet.

8. An electric resistance-measuring apparatus for circuit boards, comprising the connector for measurement of electric resistance according to claim 6, which is arranged on one surface side of a circuit board to be inspected, the electric resistance of which is to be measured, wherein the ring-like electrode of the first electrode sheet and one of the core electrodes for inspection of the second electrode sheet in the connector for measurement of electric resistance are electrically connected at the same time to each of one surface-side electrodes to be inspected in the circuit board to be inspected, thereby creating a measurable state, and wherein in this measurable state, one of the core electrodes for inspection and the ring-like electrode electrically connected to one designated one surface-side electrode to be inspected is used as an electrode for current supply, and the other one of the core electrodes for inspection and the ring-like electrode electrically connected to the one designated one surface-side electrode to be inspected is used as an electrode for voltage measurement, thereby performing measurement of electric resistance related to the designated one surface-side electrode.

9. The electric resistance-measuring apparatus for circuit boards according to claim 8, which comprises an other surface-side circuit board for inspection arranged on the other surface side of the circuit board to be inspected, wherein the other surface-side circuit board for inspection has, on its front surface, an electrode for current supply and an electrode for voltage measurement, which are arranged corresponding to each of other surface-side electrodes to be inspected of the circuit board to be inspected, formed in a state separated from each other and electrically connected to the same other surface-side electrode to be inspected.

10. An electric resistance-measuring method for circuit boards, which comprises arranging the connector for measurement of electric resistance according to claim 6 on one surface of a circuit board to be inspected, the electric resistance of which is to be measured, electrically connecting the ring-like electrode of the first electrode sheet and one of the core electrodes for inspection of the second electrode sheet in the connector for measurement of electric resistance at the same time to each of one surface-side electrodes to be inspected in the circuit board to be inspected, thereby creating a measurable state, and using, in this measurable state, one of the core electrodes for inspection and the ring-like electrode electrically connected to one designated one surface-side electrode to be inspected as an electrode for current supply and the other one of the core electrodes for inspection and the ring-like electrode electrically connected to the one designated one surface-side electrode to be inspected as an electrode for voltage measurement, thereby performing measurement of electric resistance related to the designated one surface-side electrode.

* * * * *